United States Patent
Maeda et al.

(10) Patent No.: US 8,665,352 B2
(45) Date of Patent: Mar. 4, 2014

(54) METHOD OF ACQUIRING PHYSICAL INFORMATION AND PHYSICAL INFORMATION ACQUIRING DEVICE

(75) Inventors: Noriya Maeda, Kanagawa (JP); Hiroki Ui, Tokyo (JP); Shinichiro Nishizono, Kanagawa (JP)

(73) Assignee: Sony Corporation, Tokyo (JP)

(*) Notice: Subject to any disclaimer, the term of this patent is extended or adjusted under 35 U.S.C. 154(b) by 448 days.

(21) Appl. No.: 11/598,997

(22) Filed: Nov. 13, 2006

(65) Prior Publication Data

US 2007/0146514 A1 Jun. 28, 2007

(30) Foreign Application Priority Data

Nov. 17, 2005 (JP) .................................. 2005-332871

(51) Int. Cl.
*H04N 3/14* (2006.01)
*H04N 5/335* (2011.01)

(52) U.S. Cl.
USPC ....................................... 348/302; 250/208.1

(58) Field of Classification Search
USPC .............. 348/302, 308, 320, 322, 294, 230.1; 250/208.1, 214 R, 214 P
See application file for complete search history.

(56) References Cited

U.S. PATENT DOCUMENTS

| 6,897,429 B1 * | 5/2005 | Turner et al. | 250/214 R |
| 6,972,791 B1 * | 12/2005 | Yomeyama | 348/230.1 |
| 2006/0011807 A1 * | 1/2006 | Lee et al. | 250/208.1 |

FOREIGN PATENT DOCUMENTS

| JP | 2000-04406 | 1/2000 |
| JP | 2001-298748 | 10/2001 |
| JP | 2002-320235 | 10/2002 |
| WO | WO 2006/048987 | 5/2006 |

* cited by examiner

*Primary Examiner* — Nelson D. Hernández Hernández
(74) *Attorney, Agent, or Firm* — Robert J. Depke; The Chicago Technology Law Group, LLC

(57) ABSTRACT

Disclosed is a method of acquiring physical information that acquires physical information by using a semiconductor device. The semiconductor device includes unit elements, each of which has a detecting unit and a unit signal generating unit. The method includes the steps of: providing an operation current supply unit supplying an operation current such that the unit signal generating unit outputs a unit signal, and a signal processing unit receiving the unit signal output from each of the unit elements forming the semiconductor device and outputting an output unit signal; and when a selective read mode is designated for reading the unit signal from a portion of the respective unit elements, an operation current of the output signal line of the unit signal generating unit not to be read is reduced so as to be smaller than an operation current of the output signal line of the unit signal generating unit to be read.

8 Claims, 13 Drawing Sheets

METHOD OF ACQUIRING PHYSICAL INFORMATION AND PHYSICAL INFORMATION ACQUIRING DEVICE

CROSS REFERENCES TO RELATED APPLICATIONS

The invention contains subject matter related to Japanese Patent Application JP 2005-332871 filed in the Japanese Patent Office on Nov. 17, 2005, the entire contents of which being incorporated herein by reference.

BACKGROUND OF THE INVENTION

1. Field of the Invention

The present invention relates to a method of acquiring physical information and a physical information acquiring device. More particularly, the invention relates to an operation mode in which partial information is used by reducing an information amount, by using a semiconductor device for physical quantity distribution detection, such as a solid-state imaging device including an array of a plurality of unit elements sensitive to an electromagnetic wave, such as light or radiation, incident from the outside and capable of reading an electrical signal indicating a physical quantity distribution converted into the electrical signal by the unit elements.

2. Description of the Related Art

In various applications, to detect a physical quantity distribution, a semiconductor device is widely used which includes a linear array or a matrix array of unit elements (for example, pixels) sensitive to a change in a physical quantity, such as pressure (contact or the like) or an electromagnetic wave such as light or radiation incident from the outside.

For example, in video apparatuses, a solid-state imaging device is used which includes an imaging device of a CCD (Charge Coupled Device) type, a MOS (Metal Oxide Semiconductor) type, or a CMOS (Complementary Metal-Oxide Semiconductor) type to detect a change in a physical quantity such as light (which is an example of an electromagnetic wave).

In computer apparatuses, a fingerprint recognition apparatus is used to acquire fingerprint information by detecting an image of a fingerprint based on a change in an electrical or optical characteristic corresponding to pressure. In these apparatuses, a physical quantity distribution is converted into an electrical signal by unit elements (pixels in the case of a solid-state imaging device) and the resultant electrical signal is read out.

Among the solid-state imaging devices, there is an amplification-type solid-state imaging devices. The amplification-type solid-state imaging device includes pixels of an amplification-type solid-state imaging device (Active Pixel Sensor (APS), also referred to as gain cell) in which a driving transistor for amplification is disposed in each pixel signal generating unit that generates a pixel signal corresponding to a signal charge generated by a charge generating unit. This structure is used in most of CMOS solid-state imaging devices.

In recent years, an XY address-type solid-state imaging device, for example, a CMOS image sensor is widely used which is better than a CCD-type image sensor in terms of reduction of a consumed power and a decrease in a system size.

In this amplification-type solid-state imaging device, to read out an image signal, addressing control is performed on a pixel array where a plurality of unit pixels are disposed, and signals are read from the respective unit pixels according to a determined address order or any order. That is, the amplification-type solid-state imaging device is an example of a solid-state imaging device of an address control type.

Further, in an amplification-type solid-state imaging device that is an example of an X-Y addressing solid-state imaging device in which unit pixels are arranged in a matrix, each pixel is configured by using an active element having a MOS structure (MOS transistor) so as to have an amplification capability. In this structure, a signal charge (photoelectron or hole) accumulated in a photodiode serving as a photoelectric conversion device is amplified by the active element and read out as image information.

In the X-Y addressing solid-state imaging device of this type, for example, a pixel array is formed using a large number of pixel transistors arranged in a two-dimensional matrix. Accumulation of signal charges corresponding to incident light is started on a line-by-line (row-by-row) basis or a pixel-by-pixel basis, and a current or voltage signal corresponding to the signal charge accumulated in each pixel is read sequentially from the respective pixels by accessing the pixels by means of addressing. In solid-state imaging devices of the MOS type (and of the CMOS type), the addressing is performed, for example, such that pixels are simultaneously accessed on a row-by-row basis and pixel signals are read from the accessed pixels, that is, pixel signals are read on a row-by-row basis from a pixel array.

<Structure and Operation of Solid-State Imaging Device According to Related Art>

FIG. 1 is a diagram illustrating a schematic structure of a CMOS solid-state imaging device (CMOS image sensor) according to the related art. A solid-state imaging device 1 shown in FIG. 1 is configured such that an amplifying transistor outputting a pixel signal from a unit pixel 3 forms a source follower circuit. In the same manner as JP-A-2001-298748, the transistors form a current mirror circuit.

As shown in FIG. 1, the solid-state imaging device includes an imaging unit 10 (pixel array) in which a plurality of unit pixels 3 are disposed, a scanning horizontal unit 12 and a vertical scanning unit 14 that are provided outside the imaging unit 10, a column processing unit 20 having column signal processing units 22 that are disposed for every column, a read current source unit 27 that supplies a pixel signal reading operation current (read current) to the unit pixels 3 of the imaging unit 10, a horizontal selection switch unit 60, and an output circuit 88. Each functional unit is provided on the same semiconductor substrate.

Although not shown in detail in the drawing, the unit pixels 3 are disposed in rows and columns, that is, in a two-dimensional matrix. Further, in order to select a predetermined row and read a pixel signal to a vertical signal line 18 (signal read line), each unit pixel 3 is connected to a row control line 15 that is controlled by a vertical scanning unit 14 or a vertical signal line 18 (output signal line) for transmitting a pixel signal to the column processing unit 20.

Although not shown in detail in the drawing, in the unit pixel 3, a photodiode or a pixel signal generating unit having a floating diffusion amplifier structure are provided. In this case, the photodiode generates a signal charge according to an amount of received light, and the pixel signal generating unit generates a pixel signal on the basis of the generated signal charge.

In this case, in the pixel signal generating unit, an amplifying transistor 42 having a source follower structure, which forms a circuit between the amplifying transistor 42 and the read current source unit 27 and is supplied with almost constant currents (a read current and a load current), is provided.

The column processing unit 20 is disposed on a signal path between a vertical signal line 18 of each column and a horizontal signal line 86 (locations where the column processing unit 20 is disposed are not limited to locations between the vertical signal line 18 and the horizontal signal line 86 in terms of a layout), receives a pixel signal from each vertical signal line 18, performs a predetermined signal process on the pixel signal, if necessary, and transmits a pixel signal of a predetermined column to the output circuit 88 through a horizontal signal line 86 by horizontal scanning using the horizontal scanning unit 12 (address selection in a horizontal direction).

For example, in the column processing unit 20, a circuit (column signal processing unit), which has an accumulating function holding a pixel signal S1 from a unit pixel 3, is provided. As an example, a switching transistor 112 and a storage unit 114 holding a voltage value according to the pixel signal S1 are provided. Further, the storage unit 114 may be used for a CDS (correlated double sampling) process function unit disclosed in Kazuya Yonemoto, "Basics and Applications of CCD/CMOS Image Sensor", CQ Publishing Co., Ltd., Aug. 10, 2003, First edition, Chapter 6 (FIGS. 6 to 9).

A gate of the transistor 112 is supplied with a write control signal MWR that holds a pixel signal in each storage unit 114. The pixel signal S1 is output to the vertical signal line 18, in which a potential according to a signal charge outputted from the photodiode according to incident light is reduced by a threshold voltage value of the amplifying transistor 42 having a source follower structure, and is then applied to the storage unit 114.

A switching transistor 122 is provided in a horizontal selection switch unit 60. The switching transistor 122 is configured such that its gate is supplied with a column selection control pulse ϕg from the horizontal scanning unit 12, and it outputs a pixel signal voltage Vm (pixel signal S2) stored in the storage unit 114 to the horizontal signal line 86 side at a predetermined timing.

The read current source unit 27 includes a transistor 303 (in particular, referred to as load MOS transistor) provided for each column, and a reference current source unit 310 that has a current generating unit 312 and a transistor 314 and is used commonly for all columns. The load MOS transistor 303 of each column is connected to the transistor 314 of the reference current source unit 310 such that they form a current mirror circuit therebetween. The reference current source unit 310 functions as a current control unit that controls a current flowing through the load MOS transistor 303 (corresponding to a current source transistor 304 of FIG. 5 or the like) that is provided for each column.

The output terminal of each column signal processing unit (signal holding unit 24) is connected to the horizontal signal line 86 through a transistor 122 of the horizontal selection switch unit 60. The horizontal signal line 86 is connected to the output circuit 88. The imaging signal S3 that is output from the output circuit 88 is output to the outside of the solid-state imaging device.

In this case, in the related art, the image signal S1 is amplified by using a source follower, and the load MOS transistor 303 of a current mirror type serving as a load is disposed for each column. The current value of the load MOS transistor 303 is determined by the reference current source unit 310 that functions as the load MOS current source.

The storage unit 114 is provided for each column, which forms a signal holding unit 24 of a line memory structure. The pixel signals that correspond to one row are simultaneously read out to the storage units 114 and are then temporarily stored therein. Then, the pixel signal that corresponds to the selected column at a predetermined timing by means of horizontal scanning by the horizontal scanning unit 12 is read out to the horizontal signal line 86, and transmitted to the output circuit 88.

Meanwhile, in a technology for imaging a still image that is representative of a digital still camera, a solid-state imaging device having a plurality of pixels is used as an imaging device, and pixel information of all of the pixels are independently read out to form a still image. For example, in the digital still camera, since it is necessary to achieve high definition in a still image photographed by releasing a shutter, a solid-state imaging device having a large number of pixels is used.

Meanwhile, read of the pixel information is not limited to a case where pixel information of all of the pixels is independently read out, but an operation mode may be set in which an actual amount of used pixel information is reduced, and only a portion of pixel information of the pixel array is used. For example, a thinning-out read mode in which a pixel signal is read for each row at a predetermined interval or each column at a predetermined interval, or a division mode in which a region is divided and a read operation is performed for the divided regions may be used.

For example, before photographing a still image, generally, a moving picture (subject image) is reflected on a small screen, for example, a liquid crystal monitor to confirm (monitor) the subject. In a stage where the subject is confirmed (monitoring mode), it may be a rough image (low-resolution image) according to the number of pixels in a liquid crystal monitor.

Further, when transmitting an image in a portable apparatus, such as a digital still camera or the like, a data transmission rate is limited. Accordingly, as for a still image, pixel information of all of the pixels is transmitted so as to obtain a high-resolution image, and as for a moving picture, in a state where the pixel information is thinned out to reduce an information amount, the pixel information is transmitted.

In a process of thinning-out pixel information when using a CCD-type image sensor as an imaging device, for example, a method is used in which after reading pixel information of all of the pixels from the image sensor (pixel array and imaging unit), pixel information is thinned out by using an external signal processing system. Further, even in a color camera where a MOS image sensor is used as an imaging device, a thinning-out read method in the CCD-type image sensor is used.

From this reason, in a single-plate-type color camera where a CCD-type image sensor or a MOS image sensor is used as an imaging device, after pixel information of all of the pixels is read out from an imaging sensor, a process of thinning-out the pixel information is performed by using an external signal processing system. In this case, however, since a driving frequency of the image sensor does not vary regardless of decreasing an information amount by the thinning-out process, the power consumption is not reduced, but a load is applied to a signal processing system of a subsequent stage.

In particular, in the single-plate-type camera where the MOS image sensor is used as an imaging device, the CCD-type image sensor is advantageous in low power consumption and a small-sized system, as described above. Therefore, when an amount of pixel information that is actually used is reduced, if the power consumption can be reduced without applying a load to a signal processing system of a subsequent stage, the effect thereof is increased. As a system that meets these requirements, there is a system disclosed in JP-A-2001-298748.

In the system disclosed in JP-A-2001-298748, an XY address type solid-state imaging device where a color coding arrangement is used as a unit, the unit is repeated (for example, repetition of two verticals×two horizontals), and color filters having a predetermined color coding are disposed is used. In this case, when a thinning-out read mode is designated, a clock frequency of a system is converted into a low frequency according to a degree of thinning-out, pixels are selected while skipping several pixels-by-several pixels in a row direction and a column direction based on the converted clock frequency, and pixel signals are sequentially read out.

SUMMARY OF THE INVENTION

However, in a case where the system disclosed in JP-A-2001-298748 is applied to a system shown in FIG. 1 in which a color processing unit 20 is disposed between a vertical signal line 18 of each column and a horizontal signal line 86, and pixel signals of a predetermined column are transmitted to an output circuit 88 through a horizontal signal line 86 by horizontal scanning using a horizontal scanning unit 12, it is not possible to achieve an effect of sufficiently reducing power consumption.

That is, in the system disclosed in JP-A-2001-298748, since a transistor for horizontal scanning is provided directly between the vertical signal line and the horizontal signal line, in a thinning-out read mode more than in the all-pixel read mode, the pixel signals can be selectively read from the vertical signal line of a column to be read to the horizontal signal line side, on the basis of a system clock of a low frequency (for example, see 36-th to 40-th paragraphs in JP-A-2001-298748).

In this case, if the system disclosed in JP-A-2001-298748 is applied to the structure shown in FIG. 1, since the thinning-out process by horizontal scanning is performed on the signal holding unit of the line memory structure, the pixel signals of the columns that are finally not used are also held in the storage unit 114 of the signal holding unit 24.

That is, the pixel information of all of the pixels of one row is simultaneously stored in the signal holding units 24 having the line memory structure that are connected to the vertical signal lines, and as for the columns from which the pixel signals are unnecessary, driving of the horizontal selection pulse using horizontal scanning is varied, and the pixel signals of the columns, from which the pixel information is necessary and on which thinning-out is not performed, are extracted from the signal holding unit 24.

However, when the pixel information of all columns corresponding to one row is read by the column processing unit 20 and stores it in the line memory, an operation current I0 that is necessary to transmit the pixel signal to the column processing unit 20 from the imaging unit 10 continuously flows through the vertical signal lines 18 of all columns. For this reason, even though the information amount is reduced by the thinning-out process, the amount of consumed power cannot be reduced.

This is applied to not only the thinning-out read mode but also to the operation modes, such as a division mode where a region is divided into a plurality of sub-regions and a read operation is performed for each sub-region, in which pixel information of a portion of the pixel array is only used.

Accordingly, there is a need for a physical information acquiring device and a method of acquiring the same, in which a pixel signal is read from a vertical signal line between the vertical signal line and a horizontal signal line and the pixel signal is output to the horizontal signal line through an addressing operation in a horizontal direction after a predetermined signal process is performed, if necessary, and which enables reduction in consumed power without applying a load to a signal processing system of a subsequent stage in a case where a thinning-out process of pixel information is carried out.

According to an embodiment of the invention, there is provided a method of acquiring physical information that acquires physical information for a predetermined purpose by using a semiconductor device for physical quantity distribution detection on the basis of unit signals obtained under predetermined detection conditions for the physical quantity. The semiconductor device includes unit elements disposed in a predetermined order, each unit element having a detecting unit detecting the variation in the physical quantity and a unit signal generating unit outputting the unit signal through an output signal line on the basis of the variation in the physical quantity detected by the detecting unit. An operation current supply unit that supplies an operation current such that the unit signal generating unit outputs the unit signal, and a signal processing unit that receives the unit signal output from each of the unit elements forming the semiconductor device and outputs an output unit signal based the unit signal at a predetermined timing are provided.

In this case, when a selective read mode is designated in which the unit signal is read from a portion of the respective unit elements forming the semiconductor device, an operation current of the output signal line of the unit signal generating unit not to be read is reduced so as to be smaller than an operation current of the output signal line of the unit signal generating unit to be read.

Further, as a method of reading the unit signal to the outside in a selection read mode, a method disclosed in JP-A-2001-298748 may be applied as it is. That is, when a selective read mode, such as a thinning-out read mode or a region division mode, is designated, a clock frequency of the system is converted, the unit elements are selected in the order corresponding to the color coding on the basis of the converted clock frequency, and the signals may be read out. Further, a specific unit element may be selected such that the arrangement order of the color coding is maintained, and the signal may be read out.

According to the embodiment of the invention, various advantages may be provided. For example, in order to reduce the operation current of the output signal line of the unit signal generating unit that is not to be read, the switch for performing on/off control on the current path is provided. As a result, the operation current can be made to become zero.

Alternatively, the current source is provided with respect to each output signal line, a system for controlling the current source is provided, and the current source of the unit signal generating unit not to be read may be directly controlled. In this case, an operation current of the current source of the unit signal generating unit that is not to be read may become zero by adjusting the current amount, and the minute current can be maintained which is smaller than the operation current of the output signal line of the unit signal generating unit that is to be read.

Further, when the operation current of the output signal line of the unit signal generating unit that is not to be read is set to zero, a reference voltage supply unit may be provided, which allows the operation point potential of the output signal line of the unit signal generating unit not to be read to have a predetermined value.

According to an embodiment of the invention, when the selective read mode is designated, the operation current of the output signal line of the unit signal generating unit that is not to be read is reduced to be smaller than an operation current of the output signal line of the unit signal generating unit that is to be read. The pixel signal is received from the vertical signal line between the vertical signal line and the horizontal signal line, and the pixel signal is output to the horizontal signal line by the address assigning operation in the horizontal direction after the predetermined signal process is performed, if necessary. Even in this case, the consumed power can be reduced by the reduced current amount. Further, since the selective read process can be performed at a stage where the signal is read out from the unit signal generating unit, the information amount can be compressed without applying a load to the signal processing system.

DESCRIPTION OF THE PREFERRED EMBODIMENTS

The preferred embodiments of the invention will now be described in detail with reference to the accompanying drawings. In the embodiments described below, a case is exemplified in which a CMOS imaging device corresponding to an example of a solid-state imaging device of an X-Y address type is used as a device.

However, the imaging device is only an example, and is not limited to the MOS-type imaging device. This embodiment and any other embodiment described later may be applied to any semiconductor device for physical quantity distribution detection including a linear or matrix array of plural unit elements sensitive to an electromagnetic wave incident from the outside, such as light or radiation. In particular, the imaging device is preferably used in a case in which an imaging device includes a plurality of unit pixels 3 commonly having one vertical signal line 18 in a vertical direction as one reading direction.

In the description below, the description of the arrangement or the connection relationships of the respective functional units basically relates to a signal system path so long as it is not the description of a specific stage for a layout (physical arrangement type).

<Schematic Structure of Imaging Device>

Figure 1:
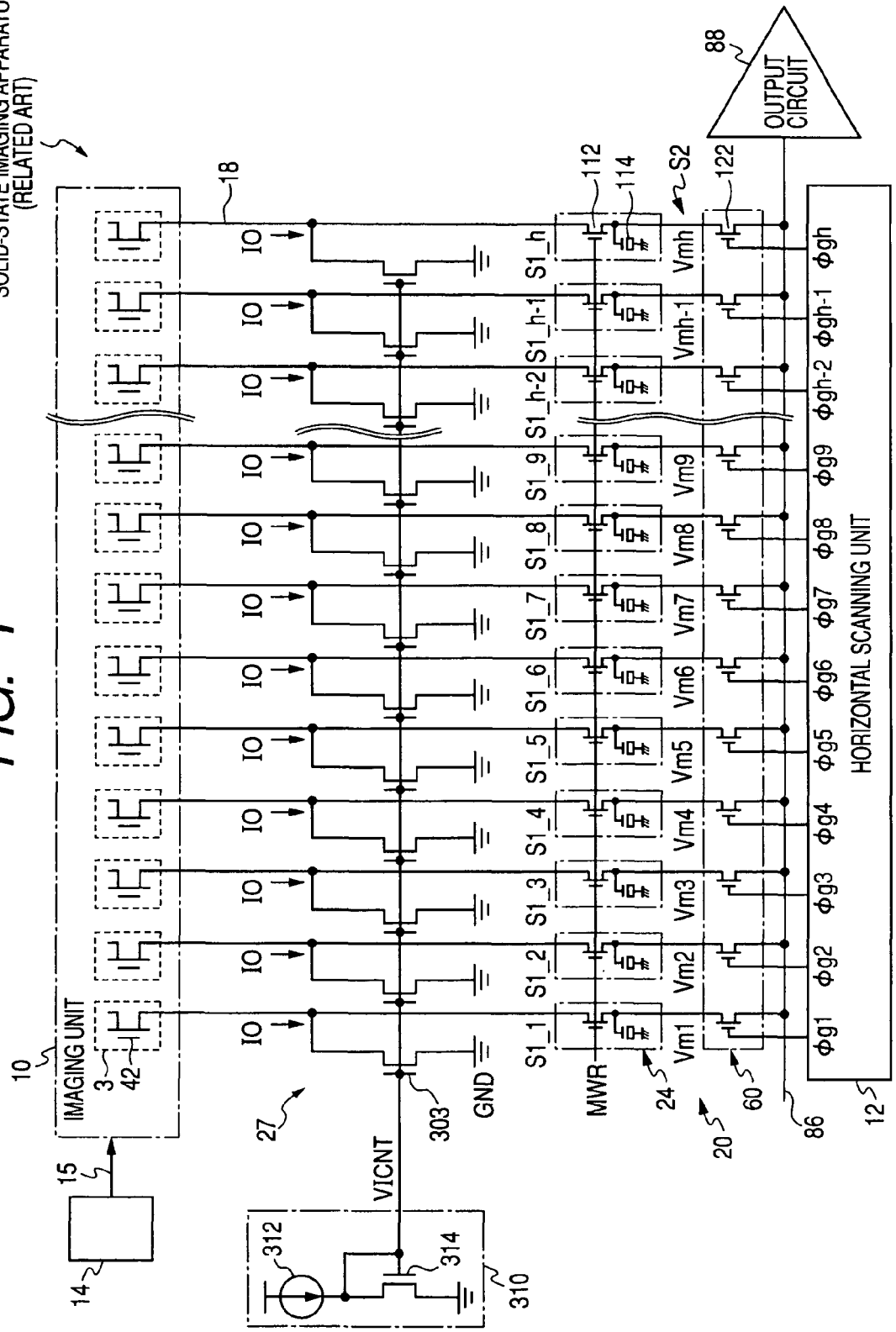
FIG. 1 is a diagram illustrating a schematic structure of a CMOS solid-state imaging device (CMOS image sensor) according to the related art.
Figure 2:
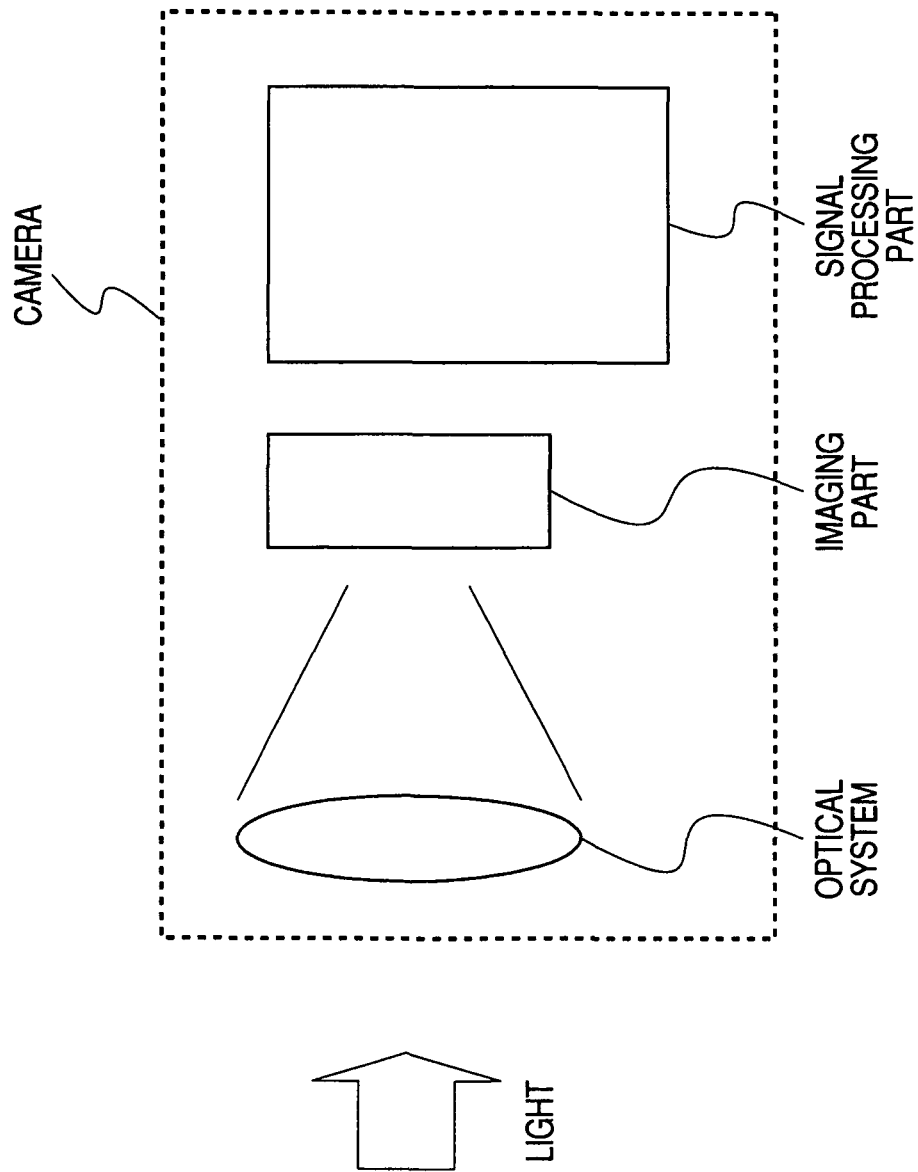
FIG. 2 is a schematic diagram of a camera with an imaging part the present invention is applied.
Figure 3:
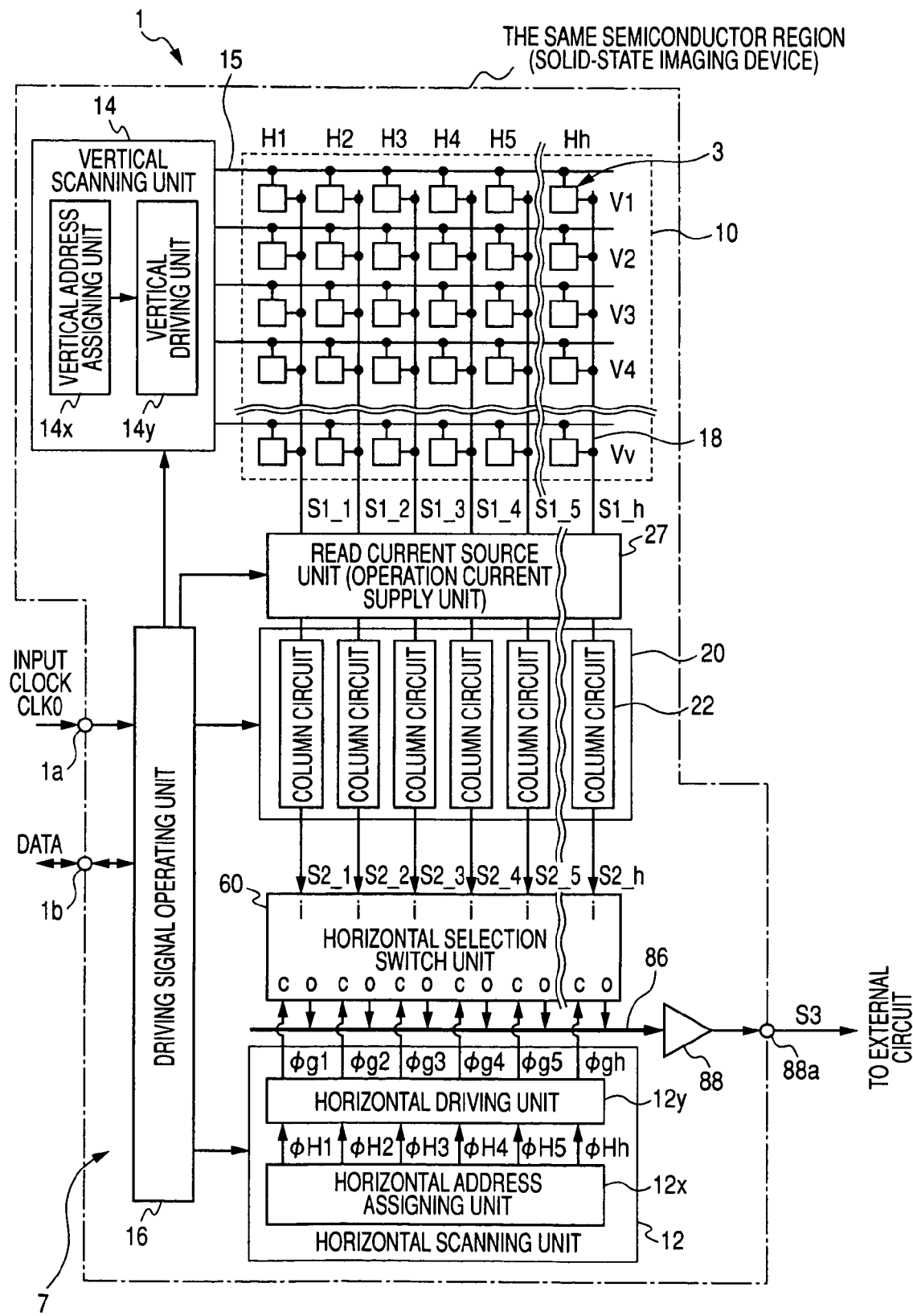
FIG. 3 is a diagram illustrating a schematic structure of a CMOS solid-state imaging device that is a physical information acquiring device according to a first embodiment of the invention.

FIG. 3 is a diagram illustrating a schematic structure of a CMOS solid-state imaging device that is a physical information acquiring device according to an embodiment of the invention. This solid-state imaging device 1 is mounted in a camera described in FIG. 2 like an electronic still camera or an FA (Factory Automation) camera, which photographs a color image. Implementation of the present invention in the device of a camera also leads to an improvement of the consumed power in the camera.

The solid-state imaging device 1 includes an imaging unit in which a plurality of unit pixels are disposed in a square lattice of rows and columns (that is, two-dimensional matrix). In this case, each of the unit pixels includes a light receiving element serving as a detecting unit (not shown) that outputs a signal according to an amount of incident light, and a signal output by each unit pixel is a voltage signal. The solid-state imaging device 1 has a column type where a CDS process functional unit or the other functional unit is provided for every column.

That is, as shown in FIG. 3, the solid-state imaging device 1 includes an imaging unit 10 (pixel array) in which a plurality of unit pixels 3 (example of a unit element) are disposed in rows and columns (two-dimensional matrix), that is, an area sensor unit, a driving control unit 7 that is provided outside the imaging unit 10, a column processing unit 20 that has column signal processing units 22 (represented as a column circuit in the drawing) disposed for every column, a read current source unit 27, and a horizontal selection switch unit 60.

Further, the read current source unit 27 is provided on a signal path (vertical signal line 18) between the imaging unit 10 and the column processing unit 20, a load transistor unit including a load MOS transistor (not shown) in which a drain terminal is connected to each vertical signal line 18 is disposed, and a load control unit (load MOS controller) that controls driving of each load MOS transistor is provided. Further, the detailed structure of the read current source unit 27 will be described in detail below.

The driving control unit 7 includes, for example, a horizontal scanning unit 12 and a vertical scanning unit 14. Further, the driving control unit 7 includes a driving signal operating unit 16 (an example of a read address control device) that supplies a control pulse to the horizontal scanning unit 12, the vertical scanning unit 14, or each functional unit of the solid-state imaging device 1, such as a column processing unit 20 at a predetermined timing.

The respective elements of the driving control unit 7 are integrally formed in a semiconductor region made of single crystal silicon by using the same technology as a semiconductor integrated circuit manufacturing technology, together with the imaging unit 10, and are constructed as a solid-state imaging device (imaging device) that is an example of a semiconductor system.

In FIG. 3, for simplification, a portion of rows and columns is omitted. Actually, several tens to several thousands of unit pixels 3 are disposed in each row or column of the imaging unit 10. Although not shown in the drawing, in the imaging unit 10, a color separation filter having predetermined color coding is formed in each pixel. As not shown in the drawing, each unit pixel 3 of the imaging unit 10 includes a photoelectric converting element, such as a photodiode or a photogate, and a transistor circuit.

The unit pixel 3 is connected to the vertical scanning unit 14 through the vertical control line 15 so as to select a column. Also, the unit pixel 3 is connected to a column processing unit 20 through the vertical signal line 18 that serves as a transmission line transmitting a pixel signal S1 (1 to h; a pixel number in one row) that is detected by a plurality of detecting units, then amplified by a unit signal generating unit having an amplifying element, and then output from the unit pixel 3.

The horizontal scanning unit 12 starts to perform a column address selection operation (for example, shift operation (scanning)) in response to a driving pulse applied by the driving signal operating unit 16, and the vertical scanning unit 14 starts to perform a row address selection operation (for example, shift operation (scanning)) in response to a driving pulse applied by the driving signal operating unit 16. Various pulse signals for driving the unit pixels 3 are included in the vertical control line 15.

The horizontal scanning unit 12 includes a horizontal address assigning unit 12x that defines a read column in a horizontal direction (address in a horizontal direction), that is, selects an individual column signal processing unit 22 in the column processing unit 20, and a horizontal driving unit 12y that guides each signal of the column processing unit 20 to the horizontal signal line 86 in accordance with a read address defined by the horizontal address assigning unit 12x.

Although not shown in the drawing, the horizontal address assigning unit 12x has a shift register or a decoder. The horizontal address assigning unit 12x has a function as a selecting unit that selects the pixel information from the column signal processing unit 22 in a predetermined order, and outputs the selected pixel information to the horizontal signal line 86.

The vertical scanning unit 14 has a vertical address assigning unit 14x that defines a read row in a vertical direction (address in a vertical direction), that is, selects the row of the imaging unit 10, and a vertical driving unit 14y that supplies a pulse to a control line with respect to the unit circuit 3 on the read address (horizontal direction) defined by the vertical address assigning unit 14x so as to drive it.

Although not shown in the drawing, the vertical address assigning unit 14x has a shutter shift register for an electronic shutter that performs row control, in addition to a vertical shift register performing basic control on a row from which a signal is read or a decoder.

The vertical shift register selects each pixel whose pixel information is read from the imaging unit 10 in a row unit, and forms a signal output row selecting unit together with the vertical driving unit 14y of each row. The shutter shift register selects each pixel in a row unit when an electronic shutter operation is performed, and forms an electronic shutter row selecting unit together with the vertical driving unit 14y of each row.

Although not shown in the drawing, the driving signal operating unit 16 includes a functional block of a timing generator TG (an example of a read address control device) that supplies a clock necessary for an operation of each unit or a pulse signal of predetermined timing, and a functional block of a communication interface that receives data instructing an input clock CLKO or an operation mode through its terminal 1a and outputs data DATA including information of the solid-state imaging device 1 through its terminal 1b. Further, the driving signal operating unit 16 outputs the horizontal address signal to the horizontal address assigning unit 12x and outputs a vertical address signal to the vertical address assigning unit 14x, and the address assigning units 12x and 14x receive the horizontal address signal and the vertical address signal, respectively, and select the corresponding row or column.

Further, the driving signal operating unit 16 may be provided as a separate semiconductor integrated circuit, independently from other functional elements, such as the imaging unit 10 or the horizontal scanning unit 12. In this case, the imaging device having the imaging unit 10 or the horizontal scanning unit 12 and the driving signal operating unit 16 form an imaging device that is an example of a semiconductor system. The imaging device may be provided as an imaging module in which a peripheral signal processing circuit or a power supply circuit is also installed.

The column processing unit 20 includes a column signal processing unit 22 that is provided for each column. The column processing unit 20 receives pixel signals of one row, and each column signal processing unit 22 processes a pixel signal S1 (1 to h; a pixel number in one row) of a corresponding column so as to output the processed pixel signal S1 (1 to h; a pixel number in one row).

For example, each column signal processing unit 22 includes a storage unit (not shown) having a storage capacitor. As a whole, the column processing unit 20 includes a line memory structure, and has a signal holding function of a line memory structure that stores a potential signal Vm indicating physical information for a predetermined purpose based on a pixel signal S1 (unit signal) read from the unit pixel 3 through the vertical signal line 18 (see FIG. 4 to be described below). Further, the column processing unit 20 may have a function as a noise removing unit that has a storage capacitor and uses a CDS (Correlated Double Sampling) process.

When performing a CDS process, on the basis of two sampling pulses, such as a sampling pulse SHP and a sampling pulse SHD applied from the driving signal operating unit 16, a process of calculating the difference between a signal level (noise level; 0 level) right after a pixel reset and a true signal level is performed on the pixel information of the voltage mode input through the vertical signal line 18, thereby removing noise signal components, such as a fixed pattern noise (FPN) due to the fixed deviation for each pixel or a reset noise.

Further, in the column signal processing unit 22, an AGC (Auto Gain Control) circuit having a signal amplifying function or the other process function circuit may be provided at a subsequent stage of the CDS process function unit or the like, if necessary.

At a subsequent stage of the column processing unit 20, a horizontal selection switch unit 60 that includes a switch for horizontal read (selection switch) not shown in the drawing is provided. An output terminal of the column signal processing unit 22 of each column is connected to an input terminal i of the selection switch of the horizontal selection switch unit 60 corresponding to each column so as to sequentially read the pixel signal S2 (output unit signal based on the pixel signal S1) from the column signal processing unit 22.

A control gate terminal c of each column of the horizontal selection switch unit 60 is connected to the horizontal driving unit 12y of the horizontal scanning unit 12 that controls and drives the read address in a horizontal direction. Meanwhile, a horizontal signal line 86 that sequentially transmits and outputs the pixel signal in a row direction is commonly connected to the output terminal o of the selection switch of each column of the horizontal selection switch unit 60. At the rear end of the horizontal signal line 86, an output circuit 88 is provided.

The horizontal signal line 86 functions as a read line that outputs an individual pixel signal S1 (specifically, a pixel signal S2 based on the pixel signal S1) transmitted from the unit pixel 3 through the vertical signal line 18 in a horizontal direction corresponding to an arrangement direction of the vertical signal line 18 in a predetermined order. The horizontal signal line 86 extracts the signal selected by a selection switch (not shown) provided for each column from the column signal processing unit 22 to then transmit it to the output circuit 88.

That is, the voltage signal of each column according to a signal charge that indicates pixel information processed by the column signal processing unit 22 is read out to the horizontal signal line 86 that is selected at a predetermined timing by means of a selection switch that is provided for each column and is driven by horizontal read pulses $\phi g1$ to $\phi gh$ according to the horizontal selection signal $\phi H1$ to $\phi Hh$ from the horizontal scanning unit 12. Then, it is input to the output circuit 88 that is provided at a subsequent end of the horizontal signal line 86.

The output circuit 88 amplifies pixel signals S2_1 to h (h=n) from the respective unit pixels 3 output from the imaging unit 10 through the horizontal signal line 86 with proper gain, and supplies it to an external circuit (not shown) as the imaging signal S3 through an output terminal 88a. For example, the output circuit 88 may only perform buffering, or may perform a black level adjusting process, a column variation correcting process, a color relationship process, or the like before performing the buffering.

That is, in the column-type solid-state imaging device 1 according to this embodiment, the output signal (voltage signal) from the unit pixel 3 is transmitted in the order of the vertical signal line 18→the column processing unit 20 (column signal processing unit 22)→the horizontal signal line 86→the output circuit 88. The driving operation is performed as follow. The pixel output signals of one row are transmitted to the color processing unit 20 through the vertical signal lines 18 in a parallel manner, and the signals processed by the color processing unit 20 are serially output through the horizontal signal line 86. The vertical transmitting operation of the pixel signal to the color processing unit 20 is simultaneously performed with respect to the unit pixels 3 of one row.

Further, if the driving can be performed for each column or each horizontal column, the pulse signals may be supplied to the unit pixels 3 in both a horizontal direction and a vertical direction, that is, a physical wiring method of a driving clock line for applying a pulse signal is not limited.

In the solid-state imaging device 1 that has the above-described structure, a CMOS image sensor is configured in which by the horizontal scanning unit 12 or the vertical scanning unit 14 and a driving signal operating unit 16 controlling it, the respective pixels of the imaging unit 10 are sequentially selected in a row unit, and information of the pixels of one selected row is simultaneously read.

The external circuit (not shown) that is provided at a subsequent stage of the output circuit 88 is constructed on a substrate (printed circuit board or semiconductor substrate) separated from a solid-state imaging device where the imaging unit 10, the driving control unit 7, and the like is integrally formed in the same semiconductor region, and a circuit structure corresponding to each photographic mode is used.

The solid-state imaging device (an example of the semiconductor device or the physical information acquiring device according to the embodiment of the invention) including the imaging unit 10, the driving control unit 7, and the like, and an external circuit form the solid-state imaging device 1. The driving control unit 7 may be separated from the imaging unit 10 or the column processing unit 20, the imaging unit 10 or the column processing unit 20 may form the solid-state imaging device (an example of a semiconductor device), and the solid-state imaging device and the separated driving control unit 7 may form the imaging device (an example of the physical information acquiring device according to the embodiment of the invention).

In this case, the external circuit that performs a signal process of a subsequent stage of the solid-state imaging device is provided outside the solid-state imaging device (imaging chip), but functional elements of all or a portion of the external circuits (for example, an A/D converting unit or a digital amplifying unit) may be built in the chip of the solid-state imaging device. That is, the external circuits are formed on the same semiconductor substrate as the solid-state imaging device where the imaging unit 10, the driving control unit 7, or the like are integrally formed in the same semiconductor region, such that the solid-state imaging device 1 and the physical information acquiring device are substantially the same.

In the drawing, the horizontal selection switch unit 60 or the driving control unit 7 and the imaging unit 10 form the solid-stage imaging device 1, and the solid-state imaging device 1 substantially functions as the physical information acquiring device. However, the structure of the physical information acquiring device is not necessarily limited thereto. All or a partial functional element of the horizontal selection switch unit 60 and the driving control unit 7 may be integrally formed in the same semiconductor region as the imaging unit 10. The horizontal selection switch unit 60 and the driving control unit 7 may be formed in a circuit board (it is not limited to a different semiconductor substrate, and also means a general circuit board) different from the substrate where the imaging unit 10 is formed, for example, a circuit board where the external circuit is provided.

<Pixel Structure>

Figure 4:
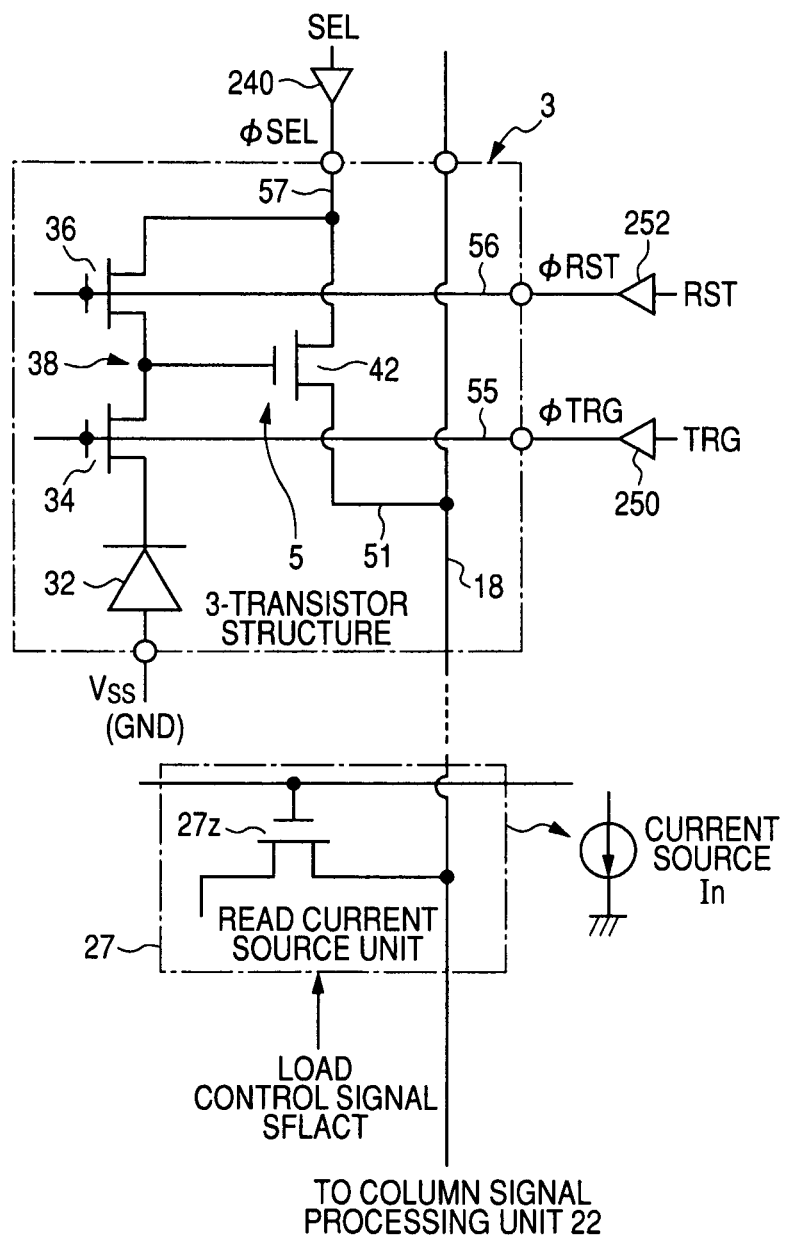
FIG. 4 is a diagram illustrating an example of a structure of a unit pixel that is used in a solid-state imaging device shown in FIG. 3.

FIG. 4 shows an example of a structure of a unit pixel 3 used in the solid-state imaging device 1 shown in FIG. 3. In the example shown in FIG. 4, the structure of each unit pixel 3 (pixel cell) in the imaging unit 10 is the same as that of a general CMOS image sensor. In this embodiment, in a CMOS sensor, a general 4 TR structure including four transistors is used as the structure of the unit pixel 3, but the invention is not limited thereto. That is, instead of the 4 TR structure employed herein, other structures, such as a 3 TR structure including three transistors disclosed in Japanese Patent No. 2708455, may also be employed. As described above, this pixel structure is only an example, and any pixel structure can be used, so long as an array structure of a general CMOS image sensor can be achieved.

As for the amplifier in the pixel, for example, a floating diffusion amplifier may be used. More specifically, for example, the charge generating unit includes a read selection transistor that is an example of a charge read unit (transfer gate unit/read gate unit), a reset transistor that is an example of a reset gate unit, a vertical selection transistor, and an amplifying transistor having a source follower structure that is an example of a detecting element detecting the potential variation of a floating diffusion.

For example, as shown in FIG. 4, the charge generating unit, and the 3 TR structure including the three transistors are used in the unit pixel 3. Therefore, an area occupied by the transistors in the unit pixel 3 is decreased to reduce the size of the pixel (for example, Japanese Patent No. 2708455).

The unit pixel 3 having the 3 TR structure includes a charge generating unit 32 (for example, photodiode) that performs a photoelectric conversion and generates a signal charge corresponding to the resultant light, an amplifying transistor 42 that is connected to a drain line DRN to amplify a signal voltage corresponding to a signal charge generated by the charge generating unit 32, and a reset transistor 36 that resets the charge generating unit 32. Further, the read selection transistor 34 (transfer gate unit) that is scanned by a vertical scanning unit 14 (not shown) through a transfer wiring line 55 (TRF) is provided between the charge generating unit 32 and the gate of the amplifying transistor 42.

The gate of the amplifying transistor 42 and the source of the reset transistor 36 are connected to the charge generating unit 32 through the read selection transistor 34, and the drain of the reset transistor 36 and the drain of the amplifying transistor 42 are connected to the drain lines. Further, the source of the amplifying transistor 42 is connected to the vertical signal line 18.

The read selection transistor 34 is configured to be driven by the transfer driving buffer 250 through the transfer wiring line 55. The reset transistor 36 is configured to be driven by the reset driving buffer 252 through the reset wiring line 56.

The transfer driving buffer 250 and the reset driving buffer 252 are driven by two voltages including a reference voltage of 0 V and a power supply voltage. In particular, a low level voltage that is supplied to a gate of the read selection transistor 34 in the pixel is 0 V.

The amplifying transistor 42 is connected to each vertical signal line 18. Further, the vertical signal line 18 is connected directly to a drain side of the load MOS transistor 27z forming a portion of the constant current source In of the read current source unit 27 (as an example of the operation current supply unit supplying an operation current) such that the pixel signal generating unit 5 outputs the pixel signal, or is connected to it through the switch, for each column (which will be described in detail).

Further, in each load MOS transistor 27z, a load control signal SFLACT (in this embodiment, in a plurality of systems) from the load control unit (not shown) is commonly input to the vertical signal line 18 with a predetermined relationship, and the predetermined constant current continuously flows through each vertical signal line 18 becoming a signal read subject by means of the load MOS transistor 27z connected to each amplifying transistor 42. However, a small amount of current (including zero) flows through the respective vertical signal lines 18 other than the signal read subject, that is, the non-read subject column from which the pixel signal does not need to be read.

That is, in regards to the respective vertical signal lines 18 of the read subject columns that become the signal read subjects, the load MOS transistor 27z forms the source follower together with the amplifying transistor 42 of the selected row, and supplies a read current of the magnitude necessary for pixel signal read to the amplifying transistor 42 such that the signal is output to the vertical signal line 18, thereby reducing power consumption.

This point is very different from the related art in which regardless of whether the vertical signal line is the signal read subject or not, the source follower is formed together with the amplifying transistor 42 of the selected row with respect to all of the vertical signal lines 18, and the read current is supplied to the amplifying transistor 42, such that the signal is output to the vertical signal line 18.

In the above description, the 'predetermined relationship' means the relationship between a column to be read and a column not to be read in a mode other than the all-pixel read mode in which the pixel signals of all of the pixels are read, that is, a mode where the pixel signal of a specific column is only read (hereinafter, referred to as column selection read mode). The specific examples of the column selection read mode may include a thinning-out read mode where a pixel signal is read for each column at a predetermined interval, a division mode where a region (in this example, particularly, in a row direction) is divided, and the read operation is performed, and the like.

Further, as a specific system which 'reduces the current flowing through the vertical signal line 18 of the non-read subject column from which the pixel signal does not need to be read out', a first system may be used where a mechanism, which allows a current of the column from which the pixel signal does not need to be read not to flow, is provided between the load MOS transistor 27z serving as a current source and the vertical signal line 18. If the first system is used, it is possible to ensure that a function of reading a pixel signal of the column, from which the pixel signal does not need to be read is not performed, which results in reducing a consumed power.

As 'the mechanism for making the current of the column from which the pixel signal does not need to be read not flow', for example, a switching unit, such as a semiconductor switch like a transistor, which turns on/off the current path (switches between the conduction state and the non-conduction state), may be provided.

Further, as a specific system for 'reducing the current flowing through the vertical signal line 18 of the non-read subject column from which the pixel signal does not need to be read', a second system may be used in which the load MOS transistor 27z serving as a current source connected to the vertical signal line 18 of the column from which the pixel signal does not need to be read is directly controlled so as to reduce the current amount. If the second system is used, it is possible to ensure that a function of reading a pixel signal of the column from which the pixel signal does not need to be read is not performed, which results in reducing a consumed power.

When 'the current amount is reduced' with respect to the column from which the pixel signal does not need to be read, the current amount may be reduced to be smaller than the amount of the load current necessary for a general read operation of a pixel signal, an activated (active) state of the load MOS transistor 27z serving as a current source may be maintained such that a small amount of current may flow, or the load MOS transistor 27z serving as a current source may be turned off (non-conductive state) such that the current rarely flows.

Further, if the current is controlled so as not to flow through the vertical signal line 18 of the column from which the pixel signal does not need to be read, the potential of the vertical signal line 18 of the corresponding column becomes unstable, and thus the system becomes unstable. In order to resolve this problem, in a state where the current does not flow through the vertical signal line 18 of the column from which the pixel signal does not need to be read, a system may be provided for fixing the potential of the vertical signal line 18 of the column not to be read to a predetermined potential.

In this case, in the unit pixel 3 that has a 3 TR structure, similar to the 4 TR structure, since the floating diffusion 38 is connected to the gate of the amplifying transistor 42, the amplifying transistor 42 outputs the signal corresponding to the potential of the floating diffusion 38 to the vertical signal line 18.

In the reset transistor 36, a reset wiring line 56 (RST) extends in a row direction, and the drain line 57 (DRN) is commonly connected to most of the pixels. The drain line 57 is driven by the drain driving buffer 240 (hereinafter, referred to as DRN driving buffer). The reset transistor 36 is driven by the reset driving buffer 252 to control the potential of the floating diffusion 38.

The drain line 57 is separated in a row direction, but the drain line 57 flows the signal current of the pixels of one row. Actually, in order to allow a current to flow in a column direction, the drain line 57 becomes a common wiring line of all rows. The signal charge that is generated by the charge generating unit 32 (photoelectric conversion element) is transmitted to the floating diffusion 38 by the read selection transistor 34.

In this case, the unit pixel 3 of the 3 TR structure is different from the unit pixel 3 of the 4 TR structure. That is, in the unit pixel 3 of the 3 TR structure, a vertical selection transistor 40 that is connected in series to the amplifying transistor 42 is not provided. The plurality of pixels are connected to the vertical signal line 18, but the pixel selection is made by not only the selection transistor but also control of the FD potential. Generally, the FD potential has a low level. When the pixel is selected, the FD potential of the selected pixel becomes a high level, and thus the signal of the selected pixel is output to the vertical signal line 18. Then, the level of the FD potential of the selected pixel is returned to a low level. This operation is simultaneously performed with respect to all of the pixels in one row.

As such, in order to control the FD potential, the following operations are performed. 1) When the FD potential of the selected row is set to a high level, the potential of the drain line 57 is set to a high level, and the FD potential is set to the high level through the reset transistor 36 of the selected row. 2) When the FD potential of the selected row is returned to the low level, the potential of the drain line 57 is set to the low level, and the FD potential is set to the low level through the reset transistor 36 of the selected row.

When the pixel signal is read, first, the reset pulse φRST becomes active, and the charge generating unit 32, such as the photodiode of the unit pixel 3 disposed in the same row, is reset. Then, each unit pixel 3 that is reset converts the incident light in the charge and accumulates the charge. If the predetermined accumulation time passes, the read current is supplied from the load MOS transistor 27z for each vertical signal line 18 to be read.

In this state, the transmission signal φTRG becomes active, and the signal charge of the charge generating unit 32 is transmitted to the floating diffusion 38. As a result, the potential of the amplifying transistor 42 of a source follower structure varies according to the signal charge. Therefore, the pixel signal S1 that is obtained by converting the incident light is read from the unit pixel 3 that is disposed in a column to which the read current is supplied, among the unit pixels 3 disposed in the subject row.

<Detailed Structure of Read Current Source Unit; First Embodiment>

Figure 5:
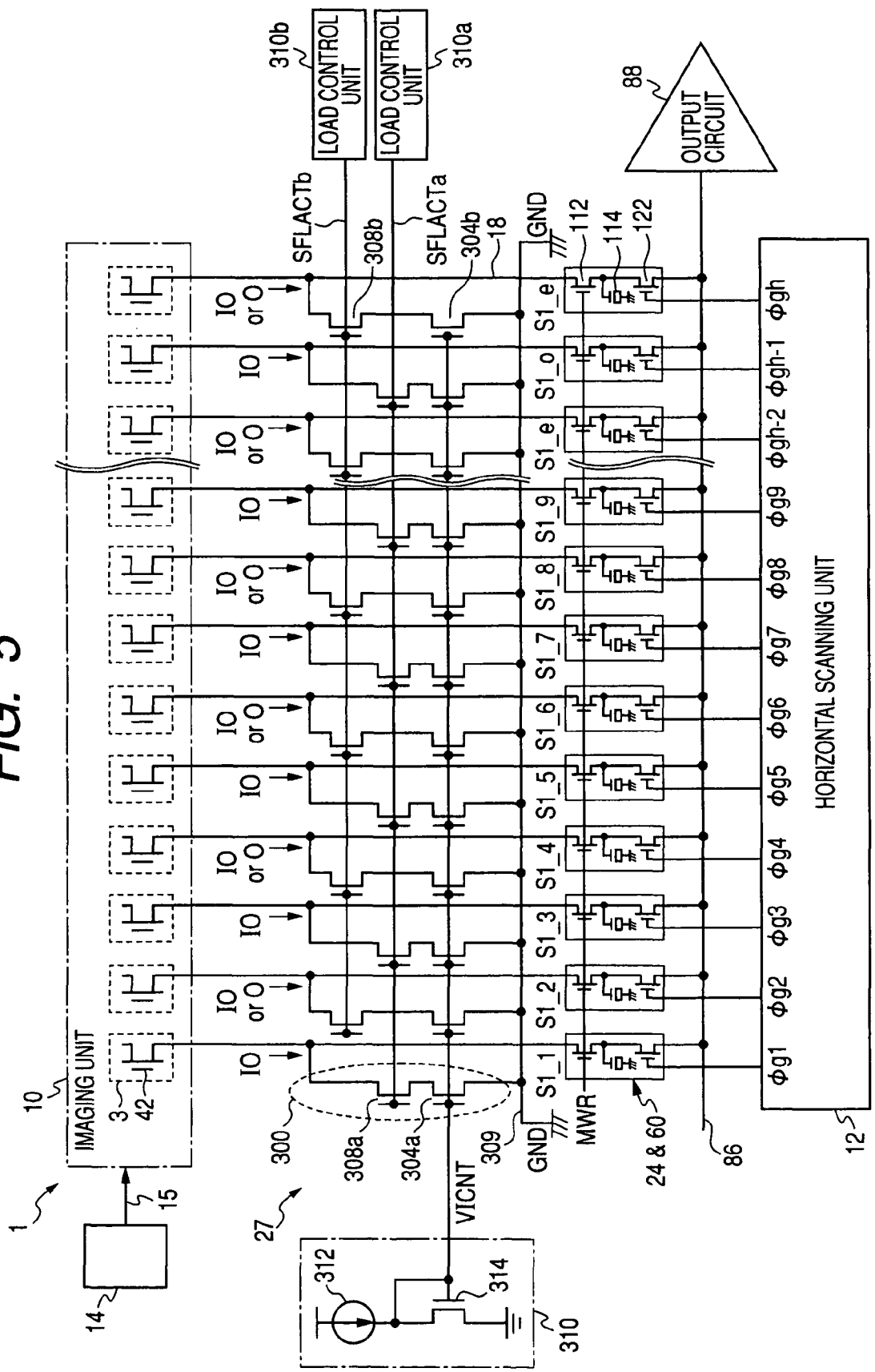
FIG. 5 is a diagram illustrating a circuit structure of a read current source unit according to a first embodiment of the invention.

FIG. 5 is a diagram illustrating a circuit structure of a read current source unit 27 according to a first embodiment of the invention. In FIG. 5, in addition to the read current source unit 27, a signal holding unit 24 (storage unit) that is provided as an example of a column processing unit 20, a horizontal scanning unit 12, and an output circuit 88 are shown (this is applicable to circuit structures according to the other embodiments to be described below).

According to the structure of the first embodiment, a current mirror circuit is used as a load of the source follower of the pixel signal generating unit 5, and the supply of the load current is individually controlled by the load control signal SFLACT of a plurality of systems from the load control unit 380 such that the read current source unit 27 corresponds to the combination of the thinned-out columns in the thinning-out read mode. Therefore, in the thinning-out read mode, the load current (source current) flowing through the vertical signal line 18 of the non-read subject column from which the pixel signal does not need to be read is reduced to be smaller than the load current of the read subject column, thereby reducing the consumed power.

In particular, in the structure according to the first embodiment, as a mechanism of controlling the current not flow through the vertical signal line 18 of the non-read subject column from which the pixel signal does not need to be read, a switching unit, such as a semiconductor switch, which switches a current path between a conductive state and a non-conductive state, is provided, such that the unnecessary pixel signal is not accumulated in the signal holding unit 24 as the column processing unit 20 having the column memory structure, thereby reducing the consumed power. It will be described in detail below.

For each column, the signal holding unit 24 includes a Nch-type transistor 112 that serves as a switch provided on the signal system path of the imaging unit 10 and the horizontal signal line 86, and a storage unit 114 (it may be a single storage element) that is provided between the horizontal signal line 86 side of the transistor 112 and the ground (GND). The storage units 114 of the respective columns are referred to as a line memory. The gate of the transistor 112 is supplied with the write control signal MWR holding a pixel signal in each storage unit 114 from a driving signal operating unit 16 (not shown).

For each column, the horizontal selection switch unit 60 includes an Nch-type transistor 122 that serves as a selection switch for horizontal read provided on the signal system, path of the horizontal signal line 86 side of the transistor 112. The gate of the transistor 122 is supplied with the driving pulses φg1 to φgh according to the horizontal selection signals φH1 to φHh from the horizontal scanning unit 12, a storage unit 114 of a column is selected at a predetermined timing, and the pixel signal S2 (Vm) that is temporally stored in the storage unit 114 is read out to the horizontal signal line 86.

Further, the read current source unit 27 according to the first embodiment includes an Nch-type transistor 304 (also referred to as a load MOS transistor or a current source transistor) that corresponds to the load MOS transistor 27z shown in FIG. 4, and an Nch-type switch transistor 308 (provided for each column) that serves as a switch switching connection between the drain of the current source transistor 304 to be a current output terminal and the vertical signal line 18 functioning as the current supply line to the pixel signal generating unit 5 of the unit pixel 3, for each column. Further, the read current source unit 27 includes a reference current source unit 310 that is commonly used in all columns.

The switch transistor 308 is provided which performs on/off switching on the current path between the current source transistor 304 and the vertical signal line 18, and the current source transistors 304 and 308 (all of them are referred to as a load MOS group 300) are connected between the vertical signal line 18 and a ground (GND) in a cascade manner. Specifically, in each switch transistor 308, a drain is connected to a vertical signal line 18, a source is connected to a drain of the power source transistor 304, and a gate is inputted with each different load control signal SFLACT from the load control unit 380 according to 'a predetermined combination relationship' with respect to each column.

The reference current source unit 310 has a current generating unit 312 that is disposed at a current side and an Nch-type transistor 314 that is disposed at a ground side on the basis of the current generating unit 312, and the transistor 314 is connected to the current source transistor 304 of each column so as to form a current mirror circuit between the current source transistor 304 and the transistor 314. Specifically, the sources of the current transistors 304 and 314 are connected to a ground (GND), and a gate of the transistor 314 is commonly connected to a gate of the current source transistor 304 of each column, is connected to the drain thereof, and is connected to the output terminal of the current generating unit 312.

The current mirror circuit receives a current signal that is output from the current generating unit 312, and is an example of a current/conversion unit that outputs a current signal of the magnitude corresponding to the magnitude of the received current signal. For the current source transistor 304 of each column and the transistor 314 of the reference current source unit 310 that form a current mirror circuit, they have the same characteristics so as to prevent the variation in the current. This is to prevent a vertical strip-like noise from occurring due to the variation in the current of each column.

Further, in each current source transistor 304, a source is commonly connected to a source line 309 that is a ground line. The source line 309 is connected to a ground (GND) at an end portion of the horizontal direction (column of right and left sides in FIG. 5). That is, an operation current (read current) of the load MOS group 300 with respect to a ground (GND) is supplied from both ends of the chip at right and left sides.

By using this structure, a source follower is used in amplifying the pixel signal S1 acquired from the unit pixel 3, and a current-mirror-type load MOS (load MOS group 300 of a read current source unit 27) serving as a load is disposed for each column. The current value of the load MOS group 300 is determined by the reference current source unit 310 that serves as the load MOS current source.

In this case, the read current source unit 27 according to the first embodiment controls is configured such that the load control signals SFLACT for on/off control supplied to the switch transistor 308 control the respective switch transistors 308a and 308b independently through independent control lines of a load control signal SFLACTa supplied to the switch transistor 308a of the read subject column and a load control signal SFLACTb supplied to the switch transistor 308b of the non-read subject column in the thinning-out read mode, as an example of the 'predetermined combination relationship'.

Figure 8:
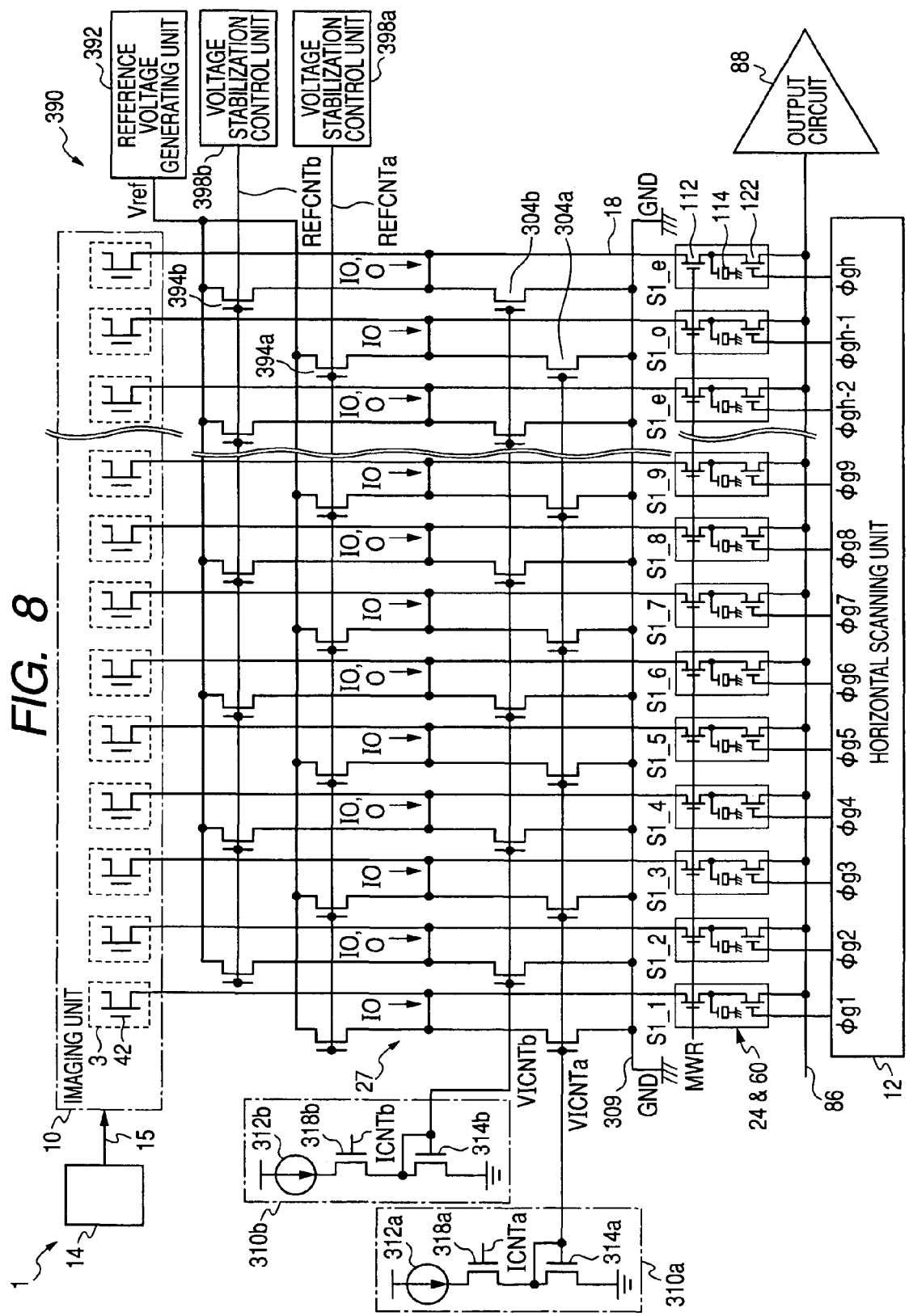
FIG. 8 is a diagram illustrating a circuit structure of a read current source unit according to a fourth embodiment of the invention.

In the example shown in the drawing, in the thinning-out read mode, one column thinning-out read operation is performed such that odd-numbered columns corresponding to the pixel signals S1_1, S1_3, . . . , and S1_2n−1 (totally referred to as S1_o) are designated as the read subject columns, and the even-numbered columns corresponding to the pixel signals S1_2, S1_4, . . . , and S1_2n (totally referred to as S1_e) are designated as the non-read subject columns, and the respective switch transistors 308a and 308b are alternately disposed. For example, as shown in FIG. 8 in JP-A-2001-298748, it may be applied to a thinning-out read mode in which the same color is used in the same column, and the color coding of repeated three primary colors is performed in the row direction.

Further, one column thinning-out mode operation is only an example of the thinning-out read mode operation. As another examples, the first column may be designated as a column from which the pixel signal is read, while the second, third, . . . , and 2n-th columns may be designated as columns from which the pixel signals are not read, or the first column may be designated as a column from which the pixel signal is not read, while the second, third, . . . , and 2n-th columns may be designated as columns from which the pixel signals are read, or any combination may be used.

For example, when the color coding is also considered, as shown in FIG. 4 in JP-A-2001-298748, in the imaging device that includes color separation filters, having a primary color coding of repetition of units each having two verticals×two horizontals (two rows and two columns), when a pixel signal is read out for each pixel while two rows and two columns are skipped, that is, every three rows and three columns, the switch transistor 308a of the read subject column and the switch transistor 308b of the non-read subject column may be disposed, such that the read subject column is disposed every third column.

Figure 6:
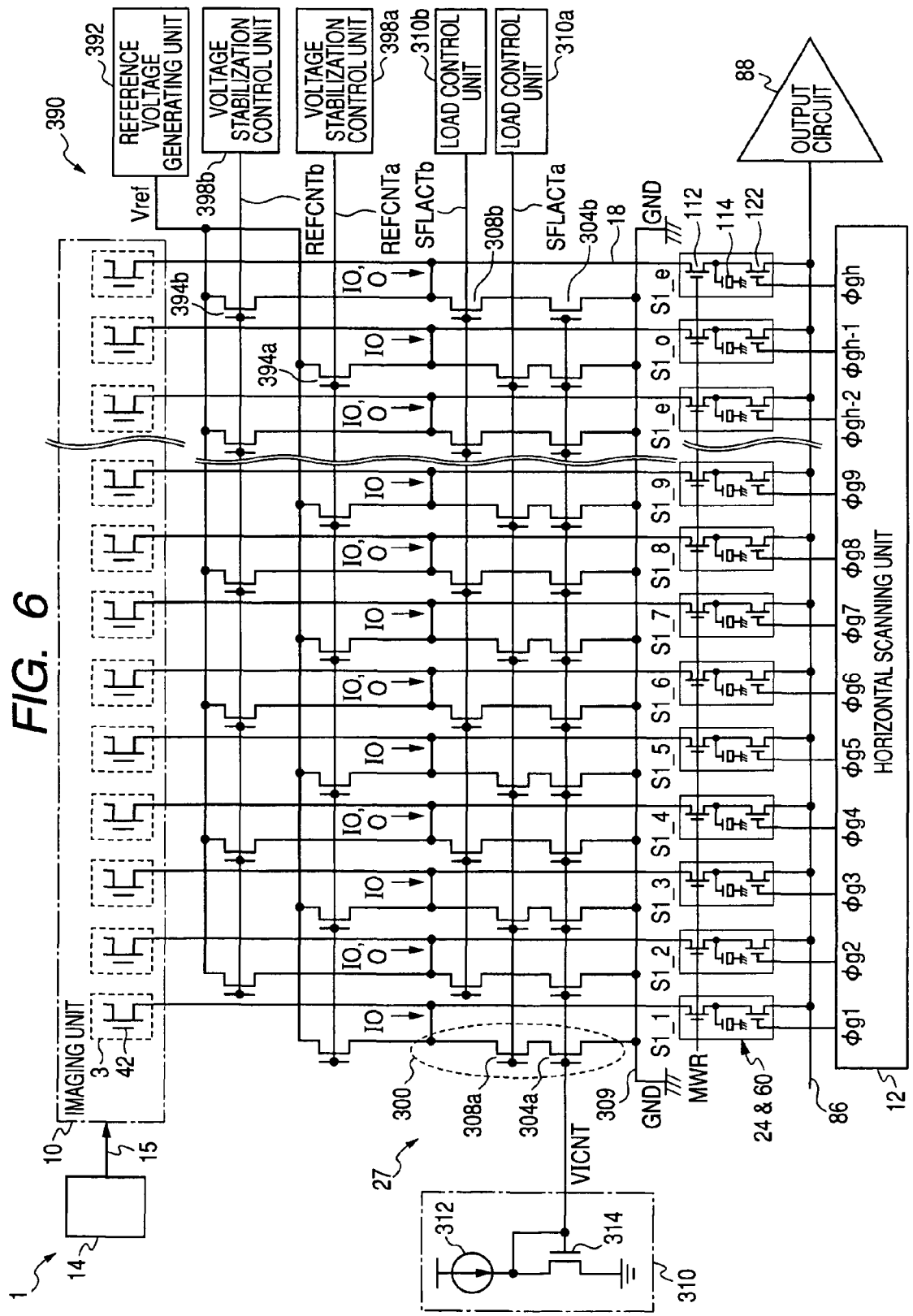
FIG. 6 is a diagram illustrating a circuit structure of a read current source unit according to a second embodiment of the invention.

As shown in FIG. 6 in JP-A-2001-298748, in the imaging device that includes color separation filters, having a primary color coding of repetition of units each having two verticals× two horizontals, when a pixel signal is successively read out for every other unit in both the row direction and the column direction, the switch transistor 308a of the read subject column and the switch transistor 308b of the non-read subject column may be disposed such that the adjacent two columns are designated as the read subject columns, and the two columns adjacent to the read subject columns are designated as the non-read subject columns.

In any case, the switch transistor 308a is disposed with respect to the read subject column and the switch transistor 308b is disposed with respect to the non-read subject column such that they can be controlled by the independent load control signals SFLACTa and SFLACTb, and reading the pixel signal is separately performed according to a column where the thinning-out is performed (that is, column where the pixel signal is unnecessary) and a column where the thinning-out is not performed (that is, column where the pixel signal is necessary). If the thinned-out locations are fixed in advance, the switch transistors 308a and 308b may be easily disposed according to the fixed locations.

The switch transistors 308a and 308b are configured to be independently controlled by the corresponding load control signals SFLACTa and SFLACTb from the load control unit 380, respectively. That is, the gates of the switch transistors 308a of the odd-numbered columns (read subject columns) commonly receive the load control signal SFLACTa, and the gates of the switch transistors 308b of the even-numbered columns (non-read subject columns) commonly receive the load control signal SFLACTb.

In this case, the load control unit 380 according to the first embodiment includes a load control unit 380a that generates a load control signal SFLACTa for a switch transistor 308a, and a load control unit 380b that generates a load control signal SFLACTb for a switch transistor 308b, such that the switch transistors 308a and 308b are independently controlled by the load control signals SFLACTa and SFLACTb, respectively. The load control units 380a and 380b function as switch control units that set the switch transistors 308a and 308b to a conductive state or a non-conductive state, respectively.

As such, the individual load control units 380a and 380b may be provided as the hardware circuit structures. In addition, the load control signals SFLACTa and SFLACTb may be independently output by the single load control unit 380.

By using this structure, in the switch transistor 308a and the current source transistor 304a of the read subject column (odd-numbered column in this example), a load current Io flows in both the all-pixel read mode and the thinning-out read mode, but in respects to the switch transistor 308b and the current source transistor 304b of the non-read subject column (in this example, even-numbered column), the load current Io flows in the full pixel output mode, while the load current does not flow in the thinning-out read mode.

That is, in the all-pixel read mode, the load control units 380a and 380b control the load control signals SFLACTa and SFLACTb, such that the switch transistors 308a and 308b located at the front stage of the current source transistor 304 enter a conductive state. As a result, by means of the function of the current source transistor 304, all pixel signals based on the signal charge that is subjected to a photoelectric conversion by each charge generating unit 32 are transmitted to the signal holding unit 24 having a line memory structure through the vertical signal line 18 and are then accumulated therein. The pixel signal that is accumulated in the signal holding unit 24 having the line memory structure is read out to the horizontal signal line 86 by the horizontal scanning unit 12, and is then output to the outside through the output circuit 88.

Meanwhile, in the thinning-out read mode, a clock frequency of a system is converted, the pixels are selected in the order corresponding to the color coding of the color filters on the basis of the converted clock frequency, and the pixel signals are read. Since the thinning-out process is not performed at a stage where the pixel signal is read out to the output circuit 88 from the unit pixel 3, an amount of pixel information can be compressed, while both the sequence of the pixel information and the spatial position relation are the same as the all-pixel read and a load is not applied to the signal processing system. The power consumption can be reduced according to the conversion in the clock frequency of the system. Even though the driving mode is varied, the frame rate may be made constant.

Further, the load control signal SFLACTb is controlled by the load control unit 380b, and the switch transistor 308b connected to the vertical signal line 18 of the non-read subject column from which the pixel signal is not read enters the non-conductive state. As a result, the switch transistor 308a connected to the vertical signal line 18 of the read subject column from which the pixel signal needs to be read enters a conductive state without accumulating the pixel signal of the non-read subject column in the signal holding unit 24 of the line memory structure, and thus the pixel signal of the read subject column is only accumulated in the signal holding unit 24 of the line memory structure and is then output to the output circuit 88 through the horizontal signal line 86 of the horizontal direction.

As such, the switch transistor 308b, which is located at the front stage of the current source transistor 304b connected to each vertical signal line 18 of the non-read subject column from which the pixel signal does not need to be read, is controlled to enter a non-conductive state. As a result, the pixel information of the plurality (in this example, even-numbered columns) of vertical signal lines 18 from which the pixel information is unnecessary can be thinned out, and the signals of the plurality (in this example, odd-numbered column) of vertical signal lines 18 from which the pixel information is necessary can be read out.

Further, in the non-read subject column (in this example, even-numbered column) from which the pixel signal is not read, since the switch transistor 308b located at the front stage of the current source transistor 304b of the non-read subject column enters a non-conductive state, even though the current source transistor 304b of the non-read subject column is in a conductive state, it does not flow the load current Io, a consumed current of the non-read subject column from which the pixel signal does not need to be read can be suppressed, which reduces the current consumption.

In addition to the structure according to the related art, since the switch (switch transistor 308) is provided on the current path for at least each non-read subject column, the scale of the circuit structure is increased, but as a system controlling 'whether or not to flow a current', it has a simple structure. The operation current of the vertical signal line 18 of the non-read subject column in the thinning-out read mode can be made zero by simple control, such as on/off control of the switch.

In the above description, the switch transistors 308 are provided with respect to all columns, and when one column thinning-out operation is performed, the load control units 380a and 380b independently control the load control signals SFLACTa and SFLACTb such that the odd-numbered columns are used as the read subject columns and the even-numbered columns are used as the non-read subject columns. In contrast, the load control units 380a and 380b may independently control the load control signals SFLACTa and SFLACTb such that the odd-numbered columns are used as the non-read subject columns and the even-numbered columns are used as the read subject columns.

Further, in the structure according to this embodiment, the switch transistors 308a are provided with respect to not only the non-read subject columns but also the non-subject columns, and the load control unit 380a for controlling the switch transistor 308a is provided. However, if each of the odd-numbered column and the even-numbered column is set to the read subject column or the non-read subject column may be fixed in advance, it is unnecessary for the switch transistors 308 to be provided with respect to all columns. The switch transistor 308b may be provided with respect to at least the non-read subject column, and the load control unit 380b which controls the switch transistor 308b with the load control signal SFLACTb may be provided.

Further, according to the relationship between the color coding and the thinning-out mode that has been described above, even though the read subject row is changed through vertical scanning using the vertical scanning unit 14, the arrangement relationship between the read subject column and the non-read subject column do not vary. Therefore, according to the color coding of the color separation filter in the imaging unit 10 of the used imaging device, the switch transistor 308a may be disposed with respect to the read subject column, and the switch transistor 308b may be disposed with respect to the non-read subject column. According to the thinning-out aspect according to the color coding, the switch transistor 308b may be only provided with respect to the non-read subject column, and the load control unit 380b controlling the switch transistor 308b using the load control signal SFLACTb may be provided, such that the circuit structure may be compact.

Further, according to the color coding aspect, if the read subject row is changed through the vertical scanning using the vertical scanning unit 14, the relationship between the read subject column and the non-read subject column may be varied. Even in this case, for example, when the relationship between the read subject column and the non-read subject column is reversed, as shown in FIG. 5, focusing on any row, the switch transistor 308a is disposed with respect to the read subject column, and the switch transistor 308b is disposed with respect to the non-read subject column, which does not cause a problem.

Meanwhile, when the read subject row is changed, in a case in which the combination relationship between the read subject column and the non-read subject column is dynamically changed (changed to a state other than the reversal), a flexible structure is necessary in which the connection aspect between the switch transistors 308a and 308b can be changed. Therefore, the gate of the switch transistor 308 of each column is controlled by matrix selection in the vertical direction and the horizontal direction, such that the read subject column and the non-read subject column can be dynamically changed.

Even in this case, during a waiting period when the pixel signal does not need to be read out from the imaging unit 10, the current source transistor 304 is controlled such that the load current Io does not flow through the vertical signal lines 18 of all columns in order to reduce the power consumption, and the current source transistors 304 of all columns may be turned off. As a result, a structure that accesses the current source transistor 304 of each column does not need to be separately provided, and they may be controlled by the reference current source unit 310.

Specifically, the structure may be used which allows to become zero a current flowing through the transistor 314 of the reference current source unit 310 forming the current mirror together with the current source transistors 304 of all columns. For example, in the same manner as the switch transistor 308, a switching unit, such as a semiconductor switch like the transistor, which turns on/off the current path (switches between the conductive state and the non-conductive state) may be provided between the current generating unit 312 serving as the current supply source to the transistor 314 and the transistor 314 (see a third embodiment to be described below).

<Detailed Structure of Read Current Source Unit; Second Embodiment>

FIG. 6 is a diagram illustrating a circuit structure of a read current source unit 27 according to a second embodiment of the invention. In the structure according to the first embodiment, in a state where the current does not flow through the vertical signal line 18 of the non-read subject column from which the pixel signal does not need to be read, a phenomenon occurs where the potential of the vertical signal line 18 of the non-read subject column becomes unstable. According to the structure of the second embodiment, in order to resolve the above-described problem, a system is provided which can improve the phenomenon from occurring in the structure according to the first embodiment.

Specifically, as shown in FIG. 6, a reference voltage supply unit 390 is further provided which supplies the reference voltage Vref with a predetermined magnitude. The reference voltage supply unit 390 includes a reference voltage generating unit 392 that generates the reference voltage Vref and supplies it commonly to the respective columns, a Pch-type or Nch-type switch transistor 394 (provided for each column) that is connected to the vertical signal line 18 of each column and functions as a switching unit to perform on/off switching control on the reference voltage supply from the reference voltage generating unit 392 (switches between a conductive state and a non-conductive state), and a voltage stabilization control unit 398 that controls the switch transistor 394.

The switch transistor 394 is provided at the front stage of the reference voltage generating unit 392. The gate of the switch transistor 394 receives each different reference voltage control signal REFCNT from the voltage stabilization control unit 398 according to a 'predetermined combination relationship' with respect to the respective columns.

In this case, the reference voltage generating unit 392 may generate the reference voltage Vref having the predetermined magnitude. For example, the reference voltage generating unit 392 may generate the reference voltage Vref having the predetermined magnitude by using the reference voltage generating element, such as a resistance dividing circuit or a zener diode. Alternatively, the reference voltage generating unit 392 may use a circuit structure in which an operation point voltage of the vertical signal line 18 at the time of reading the pixel signal is detected, and the reference voltage Vref corresponding to the detected operation point voltage (of the magnitude almost equal to the operation point voltage) is generated. The latter is more advantageous than the former in that the difference between the operation point voltage of the vertical signal line 18 when turning off the switch transistor 308 and the operation point voltage at the time of a read operation where the load current Ia is supplied can be reduced, and a stable operation can be performed.

In this case, the voltage stabilization control unit 398 is configured such that the reference voltage control signals REFCNT for on/off control supplied to the switch transistor 394 control the respective switch transistors 394a and 394b independently through independent control lines of the reference voltage control signal REFCNTa supplied to the switch transistor 394a of the read subject column and the reference voltage control signal REFCNTb supplied to the switch transistor 394b of the non-read subject column in the thinning-out read mode, as an example of the 'predetermined combination relationship', making it possible that the reference voltage Vref generated by the reference voltage generating unit 392 is supplied to the vertical signal line 18 of the non-read subject column.

In the example shown in the drawing, similar to the structure according to the first embodiment, in the thinning-out read mode, one column thinning-out read operation is performed such that the odd-numbered columns are designated as the read subject columns and the even-numbered columns are designated as the non-read subject column, and the switch transistors 394a and 394b are alternately disposed. Further, one column thinning-out mode operation is only an example of the column thinning-out read mode operation. As another examples, the first column may be designated as a column from which the pixel signal is read, while the second, third, . . . , and final columns may be designated as columns from which the pixel signals are not read, or the first column may be designated as a column from which the pixel signal is not read, while the second, third, . . . , and final columns may be designated as columns from which the pixel signals are read. This relationship is matched with the relationship between the switch transistors 308a and 308b that are provided in the current source transistor 304 side serving as the current source.

Even in any case, the switch transistor 394a is disposed with respect to the read subject column and the switch transistor 394b is disposed with respect to the non-read subject column such that they can be controlled by the independent reference voltage control signals REFCNTa and REFCNTb, and reading the pixel signal may be separately performed according to the columns from which the pixel signals need to be read out and the columns from which the pixel signals do not need to be read out.

The switch transistors 394a and 394b are independently controlled by the corresponding reference voltage control signals REFCNTa and REFCNTb from the voltage stabilization control unit 398, respectively. That is, the reference voltage control signal REFCNTa is commonly input to the gate of the switch transistor 394a of the odd-numbered column (read subject column), and the reference voltage control signal REFCNTb is commonly input to the gate of the switch transistor 394b of the even-numbered column (non-read subject column).

In this case, in order to independently control the respective switch transistors 394a and 394b by the reference voltage control signals REFCNTa and REFCENTb, the voltage stabilization control unit 398 according to the second embodiment includes a voltage stabilization control unit 398a that generates a reference voltage control signal REFCNTa for a switch transistor 394a, and a voltage stabilization control unit 398b that generates a reference voltage control signal REFCNTb for a switch transistor 394b.

As such, the individual voltage stabilization control units 398a and 398b may be provided as the hardware circuit structures. In addition, the reference voltage control signals REFCNTa and REFCNTb may be independently output by the single voltage stabilization control unit 398. This point is the same as that of the load control units 380a and 380b.

By using this structure, in the thinning-out read mode, the load control unit 380b controls the load control signal SFLACb to turn off the switch transistor 308b of the non-read subject column, making it possible for the operation current of the vertical signal line 18 of the non-read subject column to become zero. Further, the voltage stabilization control unit 398b controls the reference voltage control signal REFCNTb to turn off the switch transistor 394b, making it possible for the operation point potential of the vertical signal line 18 to become the reference voltage Vref.

The reference voltage Vref generated by the reference voltage generating unit 392 is supplied to the vertical signal line 18 of the non-read subject column, which prevents the potential of the vertical signal line 18 of the non-read subject column from which the pixel signal does not need to be read from entering a floating state (unstable state in terms of potential), and the potential can be fixed to the predetermined reference voltage Vref.

That is, in the thinning-out read mode, when the switch transistor 308b disposed on the current source transistor 304b of the non-read subject column from which the pixel signal does not need to be read out becomes a non-conductive state, the switch transistor 394 controlled by the reference voltage control signal REFCNTb by means of the voltage stabilization control unit 398b becomes a conductive state. As a result, the reference voltage Vref is supplied to the vertical signal line 18 of the non-read subject column from the reference voltage generating unit 392, and the potential of the vertical signal line 18 of the non-read subject column becomes a predetermined potential (reference voltage Vref). In this way, it can be prevented that the vertical signal line 18 of the non-read subject column from which the pixel signal does not need to be read out becomes a floating state and thus the vertical signal line 18 becomes unstable in terms of potential.

Further, when only the switch transistor 308b becomes a non-conductive state, the switch transistor 394 becomes a conductive state, and the reference voltage Vref from the reference voltage generating unit 392 is supplied to the vertical signal line 18 of the non-read subject column. Even though the column processing unit 20 of the subsequent stage has any circuit structure, it does not cause an adverse effect.

In the above description, the switch transistors 394 are provided with respect to all columns. In one column thinning-out read operation mode, the voltage stabilization control units 398a and 398b independently control the reference voltage control signals REFCNTa and REFCNTb such that the odd-numbered column is designated as the read subject column and the even-numbered column is designated as the non-read subject column. In contrast, the voltage stabilization control units 398a and 398b may independently control the reference voltage control signals REFCNTa and REFCNTb such that the odd-numbered column is designated as the non-read subject column and the even-numbered column is designated as the read subject column.

Further, in a case where whether each of the odd-numbered column and the even-numbered column is the read subject column or the non-read subject column may be fixed in advance, the switch transistors 394 do not need to be provided with respect to all columns. That is, in this case, the switch transistor 394b is provided with respect to at least the non-read subject column, and the voltage stabilization control unit 398b that controls the switch transistor 394b by the reference voltage control signal RFCNTb may be provided. This point is the same as those of the switch transistor 308b and the voltage stabilization control unit 398b according to the first embodiment.

In the above description, when only the switch transistor 308b becomes a non-conductive state, the switch transistor 394 becomes a conductive state, such that the reference voltage Vref is supplied to the vertical signal line 18 of the non-read subject column from the reference voltage generating unit 392. However, when the disadvantage does not occur in the operation of the column processing unit 20 of the subsequent stage, the reference voltage Vref may be continuously supplied regardless of whether the corresponding column is a read subject column or a non-read subject column. In this way, the voltage stabilization control unit 398 may be omitted, which allows a circuit structure to become compact. In this case, the reference voltage Vref may be continuously supplied through the resistor element having a resistance value with a predetermined magnitude, such that the adverse effect is not applied to the load current supply from the power source transistor 304.

Further, when the combination relationship between the read subject column and the non-read subject column is dynamically varied, a flexible structure that can change a connection aspect between the switch transistors 394a and 394b is necessary. In order to achieve this structure, similar to the switch transistor 308, a structure may be provided which can control the gate of the switch transistor 394 of each column is controlled by the matrix selection in the vertical direction and the horizontal direction to switch dynamically between the read subject column and the non-read subject column.

<Detailed Structure of Read Current Source Unit; Third Embodiment>

Figure 7:
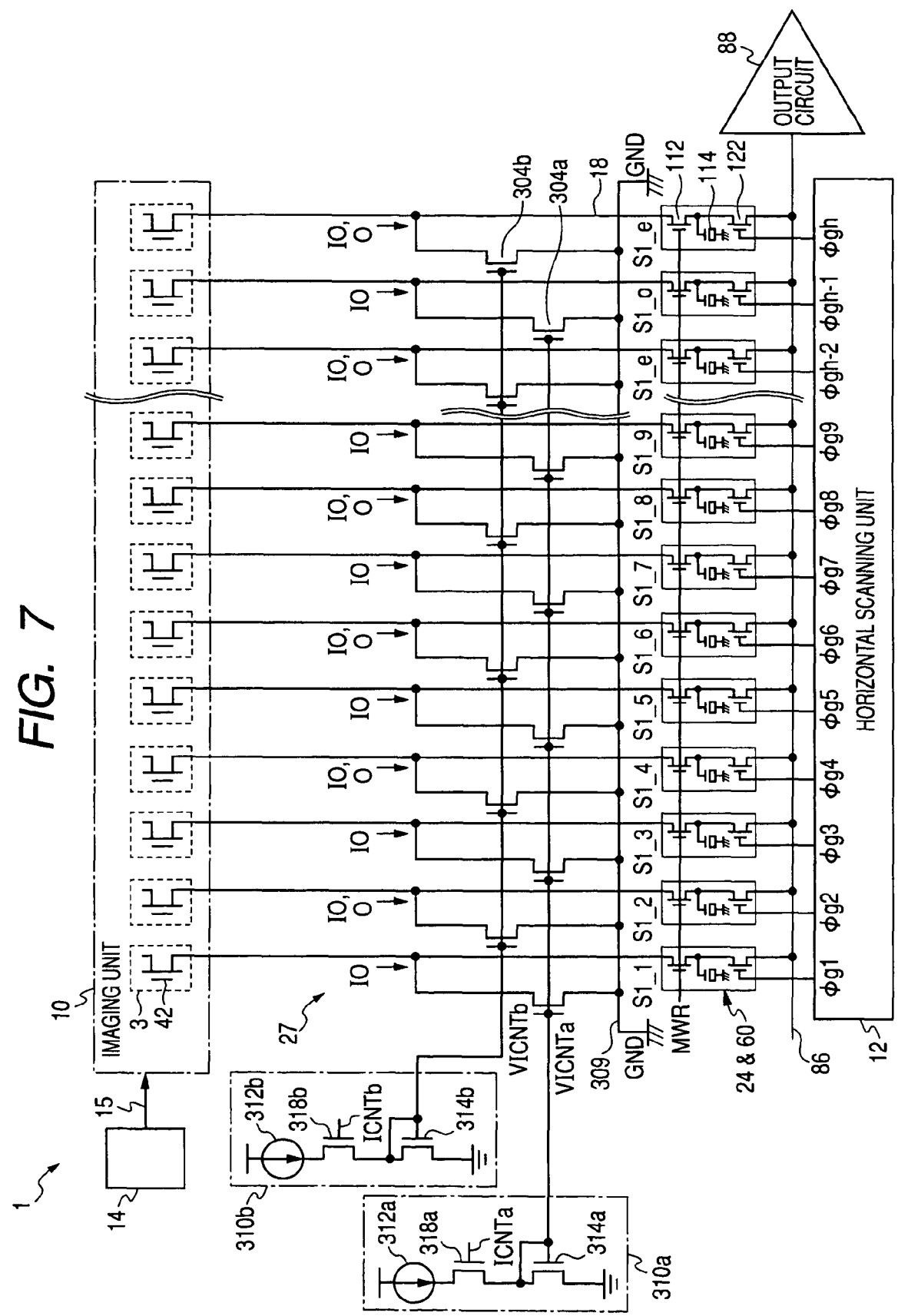
FIG. 7 is a diagram illustrating a circuit structure of a read current source unit according to a third embodiment of the invention.

FIG. 7 is a diagram illustrating a circuit structure of a read current source unit 27 according to a third embodiment of the invention. According to the structure of the third embodiment, as a specific system that 'reduces the current flowing through the vertical signal line 18 of the non-read subject column from which the pixel signal does not need to be read out', individual control is directly performed on the current source transistor 304 that is connected to the vertical signal line 18 of the non-read subject column from which the pixel signal does not need to be read out so as to correspond to the combination of the thinned-out columns in the thinning-out read mode, which reduces a current amount.

That is, the switch transistor 308 disposed on the current source transistor 304 is not controlled according to whether a corresponding mode is an all-pixel read mode or a thinning-out read mode, but the amount of current flowing through the current source transistor 304 is controlled according to whether a corresponding mode is the all-pixel read mode or the thinning-out read mode.

In particular, according to the third embodiment, when 'the current amount is reduced' with respect to the columns from which the pixel signals do not need to be read out, the current source transistor 304b of the non-read subject column is turned off (non-conductive state) such that the current does not flow through the vertical signal line 18 of the non-read subject column.

Specifically, the structure is used which can independently control the current source transistor 304a of the read subject column and the current source transistor 304b of the non-read subject column can be independently controlled. That is, first, each different current control voltage VICNT from the reference current source unit 310 is input to the gate of the current source transistor 304 according to the 'predetermined combination relationship' with respect to the respective columns.

In this case, the reference current source unit 310 according to the third embodiment is configured such that the current control voltage VICNT for current mirror supplied to the gate of the current source transistor 304 control the respective current source transistors 304a and 304b independently with a current mirror structure through independent control lines of a current control voltage VICNTa supplied to the current source transistor 304a of the read subject column and a current control voltage VICNTb supplied to the current source transistor 304b of the non-read subject column in the thinning-out read mode, as an example of the 'predetermined combination relationship'.

In the example shown in the drawing, similar to the structure according to the first embodiment, in the thinning-out read mode, one column thinning-out operation is performed such that the odd-numbered columns are designated as the read subject columns and the even-numbered columns are designated as the non-read subject column, and the current source transistors 304a and 304b are alternately disposed. Further, one column thinning-out read mode operation is only an example of the thinning-out read mode operation. That is, the first column may be designated as a column from which the pixel signal is read, while the second, third, . . . , and final columns may be designated as columns from which the pixel signals are not read, or the first column may be designated as a column from which the pixel signal is not read, while the second, third, . . . , and final columns may be designated as columns from which the pixel signals are read. This relationship is the same as the relationship between the switch transistors 308a and 308b in the structure according to the first embodiment.

Even in any case, the switch transistor 304a is disposed with respect to the read subject column and the switch transistor 304b is disposed with respect to the non-read subject column such that they can be controlled by the independent current control voltages VICNTa and VICNTb, and reading the pixel signal may be separately performed according to the columns thinning out the pixel signals and the columns not thinning out the pixel signals.

The current source transistors 304a and 304b are independently controlled by the corresponding current control voltages VICNTa and VICNTb from the reference current source unit 310. That is, the current control voltage VICNTa is commonly input to the gate of the switch transistor 394a of the odd-numbered column (read subject column) by one control line, and the current control voltage VICNTb is commonly input to the gate of the current source transistor 304b of the even-numbered column (non-read subject column) by one control line.

In this case, in order to independently control the respective current source transistors 304a and 304b by the current control voltages VICNTa and VICNTb, the reference current source unit 310 according to the third embodiment includes a reference current source unit 310a that generates a current control voltage VICNTa for a current source transistor 304a, and a reference current source unit 310b that generates a current control voltage VICNTa for a current source transistor 304b.

As such, the individual reference current source units 310a and 310b may be provided as the hardware circuit structures. In addition, the current control voltages VICNTa and VICNTb may be independently output by the single reference current source unit 310. This point is the same as those of the charge control units 380a and 380b, or the voltage stabilization control units 398a and 398b.

The respective reference current source units 310a and 310b use a structure that can change to zero, a current Io flowing through the transistor 314a of the reference current source unit 310a constituting the current mirror together with the current source transistor 304a of the read subject column or a current Iob flowing through the transistor 314b of the reference current source unit 310b constituting the current mirror together with the current source transistor 304b of the non-read subject column.

Specifically, similar to the switch transistor 308, the switch transistors 318a and 318b serving as switching units that performs on/off switching control on the current path (switches between a conductive state and a non-conductive state) are provided between the current generating units 312a and 312b serving as the current supply source to the transistors 314a and 314b, and the transistors 314a and 314b. The control signals ICNTa and ICNTb that perform on/off control on the switch transistors 318a and 318b are supplied to the gates of the switch transistors 318a and 318b.

By using this structure, it is possible to independently control the amount of the current flowing through the current source transistors 304a and 304b according to whether the corresponding mode is the all-pixel read mode or the thinning-out read mode. That is, even in the current source and the method of controlling the current source, the function of reading the pixel signal of the non-read subject column from which the pixel signal does not need to be read out is not performed, and the necessary pixel signal may be accumulated in the signal holding unit 24 of the line memory structure.

Further, in the thinning-out read mode, the current source transistor 304b of the non-read subject column from which the pixel signal does not need to be read out is set to the non-conductive state. As a result, the current source transistor 304b of the non-read subject column does not flow the load current Io. Similar to the first embodiment, it is possible to suppress the consumed current of the non-read subject column from which the pixel signal does not need to be read out, which reduces the current consumption.

In the state where the addition circuit of a specific stage is not provided on a current path, a system is provided in which a reference current source unit that corresponds to the current source (current source transistor 304) of at least the non-read subject column is controlled so as to directly control whether or not to flow the current through the current source of the non-read subject column. Therefore, the structure of the third embodiment becomes more compact than the structure of the first embodiment.

Further, as the system for controlling the reference current source unit, one switch (switch transistor 318) may be provided on the current path between the transistor 314 built in the reference current source unit 310 that constitutes the current mirror together with the current source transistors 304 of each column and the reference current source (current generating unit 312). In addition, the system that controls whether the current flows or not may have a very simple structure. In the thinning-out read mode, the operation current of the vertical signal line 18 of the non-read subject column can be set to zero by the simple control, such as on/off control on a switch at one location.

Further, in the above description, with respect to the reference current source unit 310a forming a current mirror together with the current source transistor 304a of the read subject column and the reference current source unit 310b forming a current mirror together with the current source transistor 304b of the non-read subject column, the switch transistors 318a and 318b are provided, respectively. In one column thinning-out operation mode, the control signals ICNTa and ICNTb are independently controlled such that the odd-numbered column is designated as the read subject column and the even-numbered column is designated as the non-read subject column. In contrast, the control signals ICNTa and ICNTb may be independently controlled such that the odd-numbered column may be designated as the non-read subject column and the even-numbered column may be designated as the read subject column.

Further, in the case where each of the odd-numbered column and the even-numbered column is the read subject column or the non-read subject column may be fixed in advance, the switch transistor 318b may be provided with respect to at least the non-read subject column, and the switch transistor 318b may be controlled by the control signal ICNTb. This point is the same as that of the first embodiment, and it is applicable to the above-described color coding and thinning-out read.

Further, when the read subject row is changed, if the combination relationship between the read subject column and the non-read subject column is dynamically changed, a flexible structure is necessary which can change the connection aspect between the current source transistor 304a for a read subject column and a current source transistor 304b for a non-read subject column.

In order to achieve this structure, the reference current source unit 310 that includes a switch transistor 318 is prepared individually with respect to a current source transistor 304 of each column, a gate of the switch transistor 318 corresponding to each column is controlled by selection of a matrix in a vertical direction and a horizontal direction according to the thinned-out location, so that the read subject column correspondence and the non-read subject column correspondence can be dynamically changed.

In this case, however, during a waiting period when the pixel signal does not need to be read from the imaging unit 10, the current source transistor 304 is controlled such that the load current Io does not flow through the vertical signal lines 18 of all columns in order to reduce the power consumption, and the current source transistors 304 of all columns are turned off. In this case, a system needs to be provided. In regards to this point, in the structure, the switch transistor 318a is provided with respect to the read subject column, and the structure that controls the switch transistor 318a by the control signal ICNTa may remain.

<Detailed Structure of Read Current Source Unit; Fourth Embodiment>

FIG. 8 is a diagram illustrating a circuit structure of a read current source unit 27 according to a fourth embodiment of the invention. According to the structure of the fourth embodiment, in the structure according to the third embodiment, when the current does not flow through the vertical signal line 18 of the non-read subject column from which the pixel signal does not need to be read out, the phenomenon of when the potential of the vertical signal line 18 of the non-read subject column becomes unstable can be prevented by using the same system as the second embodiment.

Specifically, in the same manner as the second embodiment, the read current source unit includes a reference voltage supply unit 390 that supplies the reference voltage Vref having a predetermined magnitude. Each of the reference voltage generating unit 392, the switch transistor 394, and the voltage stabilization control unit 398 has the same structure as the second embodiment. Therefore, the description thereof will be omitted.

By using this structure, in the thinning-out read mode, the reference voltage Vref generated by the reference voltage generating unit 392 is supplied to the vertical signal line 18 of the non-read subject column such that the potential of the vertical signal line 18 of the non-read subject column from which the pixel signal does not need to be read out enters a floating state (unstable state in potential), and the voltage can be fixed to a specific reference voltage Vref. That is, it is possible to achieve the same effect as the second embodiment.

<Detailed Structure; Fifth Embodiment>

Figure 9:
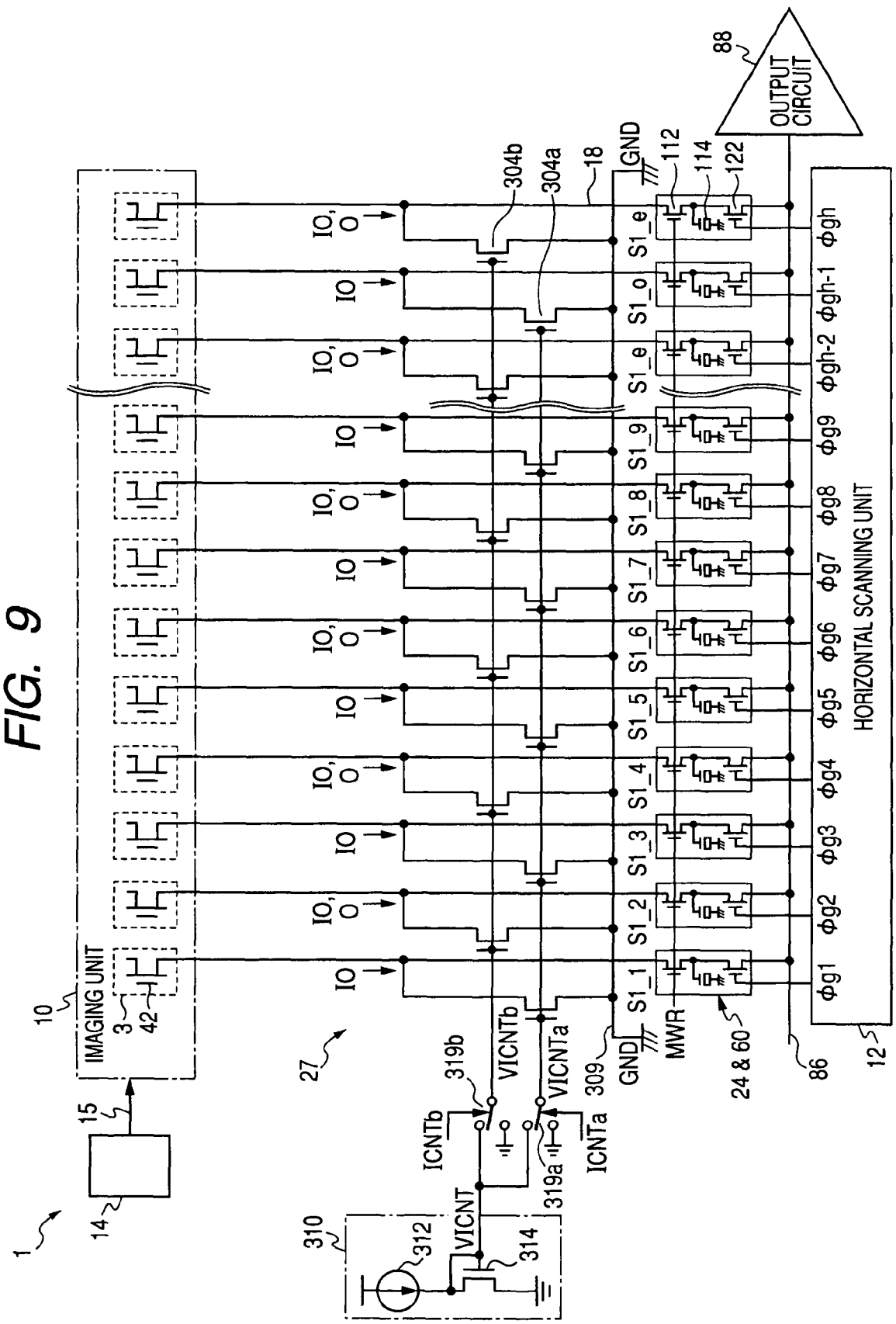
FIG. 9 is a diagram illustrating a circuit structure of a read current source unit according to a fifth embodiment of the invention.

FIG. 9 is a diagram illustrating a circuit structure of a read current source unit 27 according to a fifth embodiment of the invention. FIG. 9 illustrates a modification of the third embodiment. However, the same system is applied to the fourth embodiment.

According to the structure of the fifth embodiment, in the same manner as the third and fourth embodiments, the current source transistor 304 connected to the vertical signal line 18 of the non-read subject column from which the pixel signal does not need to be read out is directly controlled so as to correspond to the combination of the thinned-out column in the thinning-out mode, which reduces a current amount.

In this case, in the structure of the fifth embodiment, when the current amount is reduced with respect to the columns from which the pixel signal does not need to be read out, the current source transistor 304b of the non-read subject column is turned off (non-conductive state) such that the current does not flow through the vertical signal line 18 of the non-read subject column. Alternatively, different from the third and fourth embodiments, the current control voltage VICNT for a current mirror that is supplied to the gate of the current source transistor 304 output from the common reference current source unit 310 is divided into two systems, and control is performed according to whether the corresponding mode is the all-pixel read mode or the thinning-out read mode.

In the structures according to the third and fourth embodiments, since the reference current source unit 310 is divided into two systems, in the case of the previous column, the current sources are disposed with respect to the odd-numbered column and the even-numbered column, and a vertical strip may occur due to the variation in manufacturing the current source in the all-pixel read mode. In order to resolve this problem, according to the fifth embodiment, the current control voltage VICNT from one current source is divided into two voltages, and control is performed according to whether the corresponding mode is the all-pixel read mode or the thinning-out read mode.

That is, as shown in the drawing, as a unit that divides the current control voltage VICNT generated at the gate of the transistor 314 of the reference current source 310 into two systems, the switch circuit 319a for an odd-numbered column and the switch circuit 319b for an even-numbered column are provided.

Each of the switch circuits 319a and 319b has a two-input and one-output structure. In each of the switch circuits 319a and 319b, the current control voltage VICNT from the reference current source unit 310 side is input to one input terminal, and the other input terminal is connected to a ground. The output terminals of the switch circuits 319a and 319b are commonly connected to the gates of the corresponding current source transistors 304a and 304b. The reason why the other input terminals of the switch circuits 319a and 319b are connected to a ground is to prevent when the switch circuits 319a and 319b are made to be turned off, the gate potential at the current source transistors 304a and 304b become a floating state, and the unstable state is entered.

To the control input terminals of the respective switch circuits 319a and 319b, the control signals ICNTa and ICNTb performing control such that the current control voltages VICNTa and VICNTb as the output signals of the switch circuits 319a and 319b become the current control voltage VICNT from the reference current source unit 310 or the ground potential are supplied.

By using this structure, the same effect as the third embodiment can be obtained. Further, since one reference current source unit 310 can be provided, it is possible to achieve the more compact structure than the third embodiment. In the all-pixel read mode, since the current control voltage VICNT from the reference current source unit 310 are commonly supplied to the gates of the current source transistors 304 of all columns, different from the deviation of the current source transistor 304, a vertical stripe due to the deviation of the current source (current generating unit 312 in this example) does not occur.

<Detailed Structure of Read Current Source Unit; Sixth Embodiment>

Figure 10:
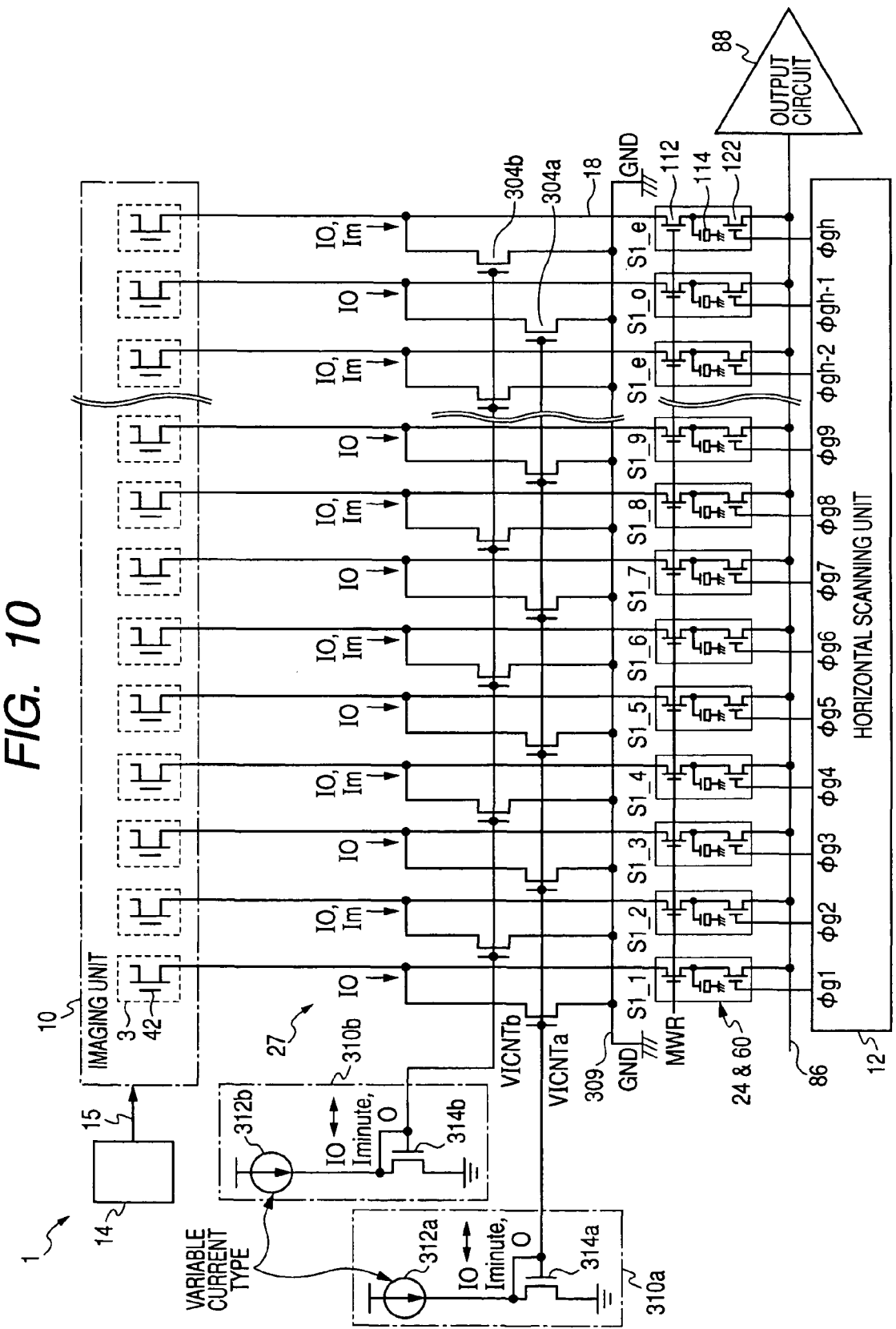
FIG. 10 is a diagram illustrating a circuit structure of a read current source unit according to a sixth embodiment of the invention.

FIG. 10 is a diagram illustrating a circuit structure of a read current source unit 27 according to a sixth embodiment of the invention. A structure according to the sixth embodiment is the same as that of the third embodiment in that as a specific system for reducing a current flowing through the vertical signal line 18 of the non-read subject column from which the pixel signal does not need to be read out, a system is used in which the current source transistor 304 connected to the vertical signal line 18 of the non-read subject column from which the pixel signal does not need to be read out is individually controlled so as to correspond to the combination of the thinned-out columns in the thinning-out read mode, thereby reducing the current amount.

In addition, in particular, according to the sixth embodiment, when the current amount is reduced with respect to the columns from which the pixel signal does not need to be read out, the current source transistor 304b of the non-read subject column may be turned off (non-conductive state), and the minute current Iminute (indicates Im on a column in the drawing) smaller than the load current Io for pixel signal read can flow.

Specifically, similar to the third embodiment, the independent reference current source units 310a and 310b are provided to independently control the current source transistor 304a of the read subject column and the current source transistor 304b of the non-read subject column. Also, the current source control voltages VICNTa and VICNTb can be independently output by the single reference current source 310. This point is the same as that of the third embodiment.

In this case, according to the structure of the sixth embodiment, the sixth embodiment is different from the third embodiment in that in the thinning-out read mode, the operation current of the current source transistor 304b of the non-read subject column may be made to be zero, and the minute current Iminute may flow. Specifically, as shown in the drawing, the current generating unit 312b of the reference current source unit 310b that corresponds to the current source transistor 304b of the non-read subject column may be configured by a variable-current-type current source.

That is, when the thinning-out read mode is designated, a reference current source unit 310b related to the current source transistor 304b is provided as a current control unit in which the current source transistor 304b is controlled with respect to the non-read subject column, and the current flowing through the current source transistor 304b is controlled to be smaller than the current I0 flowing through the current source transistor 304a of the read subject column.

Since the variable-current-type current source having the above-described structure is known, the description thereof is omitted. Further, by controlling the variable-current-type current source, similar to the third embodiment, in the thinning-out read mode, the operation current of the current source transistor 304b of the non-read subject column can be made to be zero.

By using the above-described structure, it is possible to independently control the amount of a current flowing through the current source transistors 304a and 304b according to whether the corresponding mode is an all-pixel read mode or the thinning-out read mode. In the thinning-out read mode, and the minute current Iminute can flow through the current source transistor 304b of the non-read subject column from which the pixel signal does not need to be read out. Although the current reduction effect can be lowered as compared with the first to fourth embodiments, it is possible to sufficiently suppress an extra consumed current of the non-read subject column from which the pixel signal does not need to be read out, which reduces a consumed current.

An addition circuit of a specific stage is not provided on a current path, and the reference current source unit corresponding to the current source (current source transistor 304) of at least the non-read subject column is controlled so as to directly the amount of the current flowing through the current source of the non-read subject column, which becomes more compact than the structure of the first embodiment.

Further, as the system for controlling the reference current source unit, the reference current source (current generating unit 312) that supplies the current to the transistor 314 built in the reference current source unit 310 constituting the current mirror between current source transistors 304 between the respective columns may be configured by a variable-current-type current source, and the circuit size can be reduced. Further, by adjusting the control amount, the operation current of the vertical signal line 18 of the non-read subject column can be made to be zero.

Further, in the thinning-out read mode, if the operation current of the current source transistor 304b of the non-read subject column is made not to be zero and the minute current Iminute may flow, the minute current Iminute can be used as the potential fixing current of the vertical signal line 18. Therefore, as in the second or fourth embodiment, even though the reference voltage supply unit 390 and the voltage stabilization control unit 398 are not provided, the potential of the vertical signal line 18 of the non-read subject column from which the pixel signal does not need to be read out can be prevented from becoming a floating state, and it can be fixed to a predetermined voltage.

<Detailed Structure of Read Current Source Unit; Seventh Embodiment>

Figure 11:
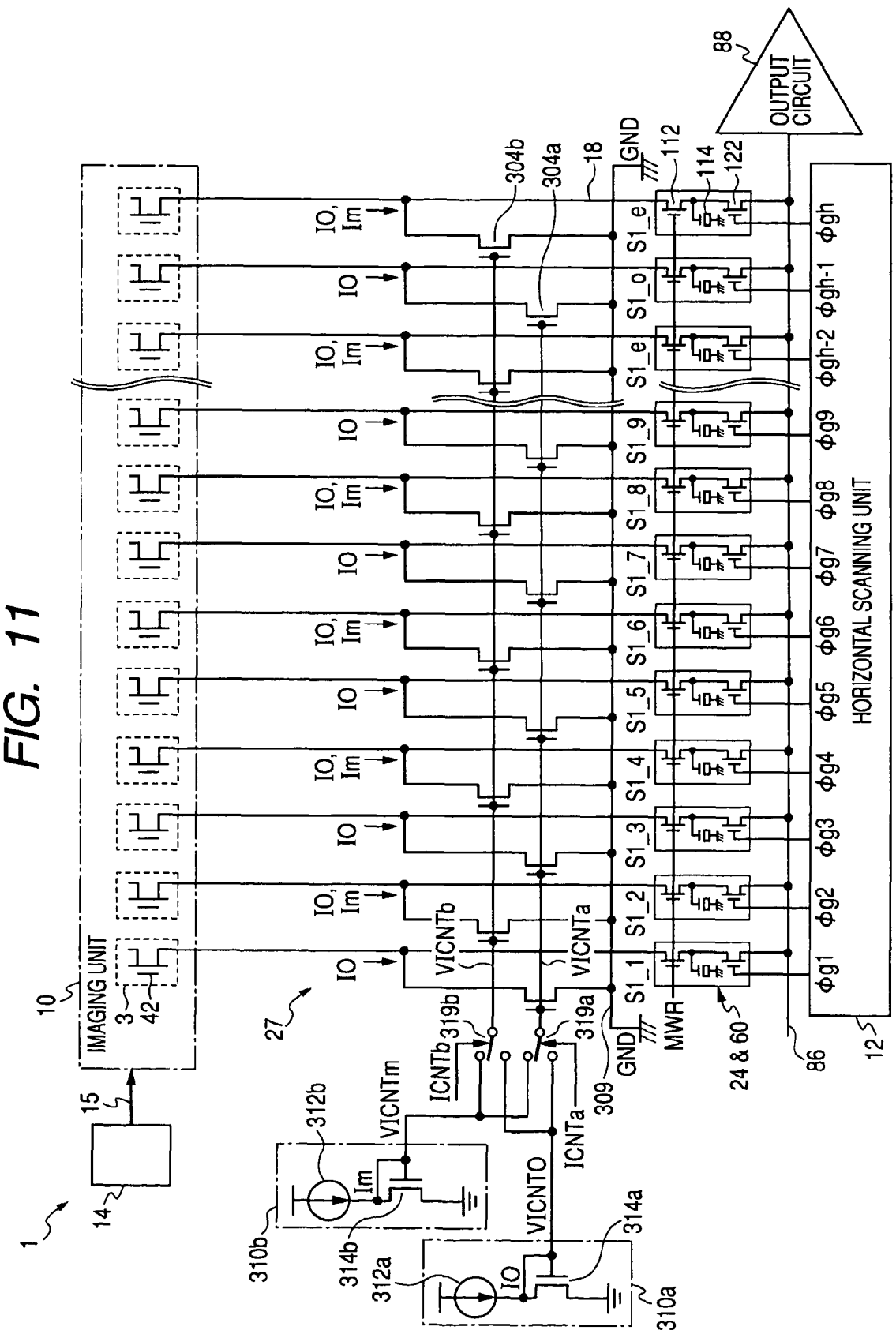
FIG. 11 is a diagram illustrating a circuit structure of a read current source unit according to a seventh embodiment of the invention.

FIG. 11 is a diagram illustrating a circuit structure of a read current source unit 27 according to a seventh embodiment of the invention. FIG. 11 shows a modification of the sixth embodiment shown in FIG. 10. In the seventh embodiment, the system of the second embodiment where the reference voltage supply unit 390 is provided is used, as in the sixth embodiment which uses the system of the second embodiment where the reference voltage supply unit 390 is provided.

According to the seventh embodiment, when 'the current amount is reduced' with respect to the column from which the pixel signal does not need to be read out, the current source transistor 304b of the non-read subject column is controlled to flow the minute current Iminute. Alternatively, different from the sixth embodiment, the current control voltage VICNT for a current mirror that is output from the common reference current source unit 310 and supplied to the gate of the current source transistor 304 is divided into two systems, and the two voltages are controlled according to whether the corresponding mode is the all-pixel read mode or the thinning-out read mode.

Although the seventh embodiment is similar to the fifth embodiment, the current flowing through the current source transistor 304b of the column from which the pixel signal does not need to be read out is controlled to be zero, in the fifth embodiment. However, in the seventh embodiment, the system for allowing the minute current Iminute flow is provided.

That is, as shown in the drawing, the reference current source unit 310a that defines an operation current I0 for reading the pixel signal, and the reference current source unit 310b that defines the minute current Iminute (it can be made to be zero) when the pixel signal is not read are provided. Different from the sixth embodiment, the reference current source units do not need to have a variable current type. In addition, the current generating unit 312a of the reference current source unit 310a may flow the operation current I0 for reading the pixel signal, and the current generating unit 312b of the reference current source unit 310b may flow the minute current Iminute when the pixel signal is not read.

In addition, as the units for dividing the current control voltages VICNT0 and VICNTm generated at the respective gates of the transistors 314a and 314b of the reference current source units 310a and 310b into two systems, the switch circuit 319a for odd-numbered columns and the switch circuit 319b for even-numbered columns are provided.

Each of the switch circuits 319a and 319b has a two input-one output type. The current control voltage VICNT0 from the reference current source unit 310a side is input to one input terminal of each of the switch circuits 319a and 319b, the current control voltage VICNTm from the reference current source unit 310b side is input to the other input terminal of each of the switch circuits 319a and 319b, and the output terminals thereof are commonly connected to the gates of the corresponding current source transistors 304a and 304b.

When the seventh embodiment is compared with the fifth embodiment, the other input terminals of the switch circuits 319a and 319b are connected to a ground such that the current source transistor 304b is turned off, in the fifth embodiment, and the current control voltage VICNTm is input to the current source transistor 304b such that the minute current Iminute flows, in the seventh embodiment.

Similar to the fifth embodiment, the control input terminals of the respective switch circuits 319a and 319b are supplied with the control signals ICNTa and ICNTb for performing control, such that the current control voltages VICNTa and VICNTb to be the output signals of the switch circuits 319a and 319b become the current control voltage VICNT0 from the reference current source unit 310a side or the current control voltage VICNTm from the reference current source unit 310b side.

By using this structure, the same effect as the sixth embodiment can be obtained. In the all-pixel read mode, since the current control voltage VICNT0 are commonly supplied to the gates of the current source transistors 304 of all columns from the reference current source unit 310a, aside from the variation in the current source transistor 304, the vertical stripe-like noises does not occur due to the variation in the current source (current generating unit 312 in this example).

<Detailed Structure of Read Current Source Unit; Eighth Embodiment>

Figure 12:
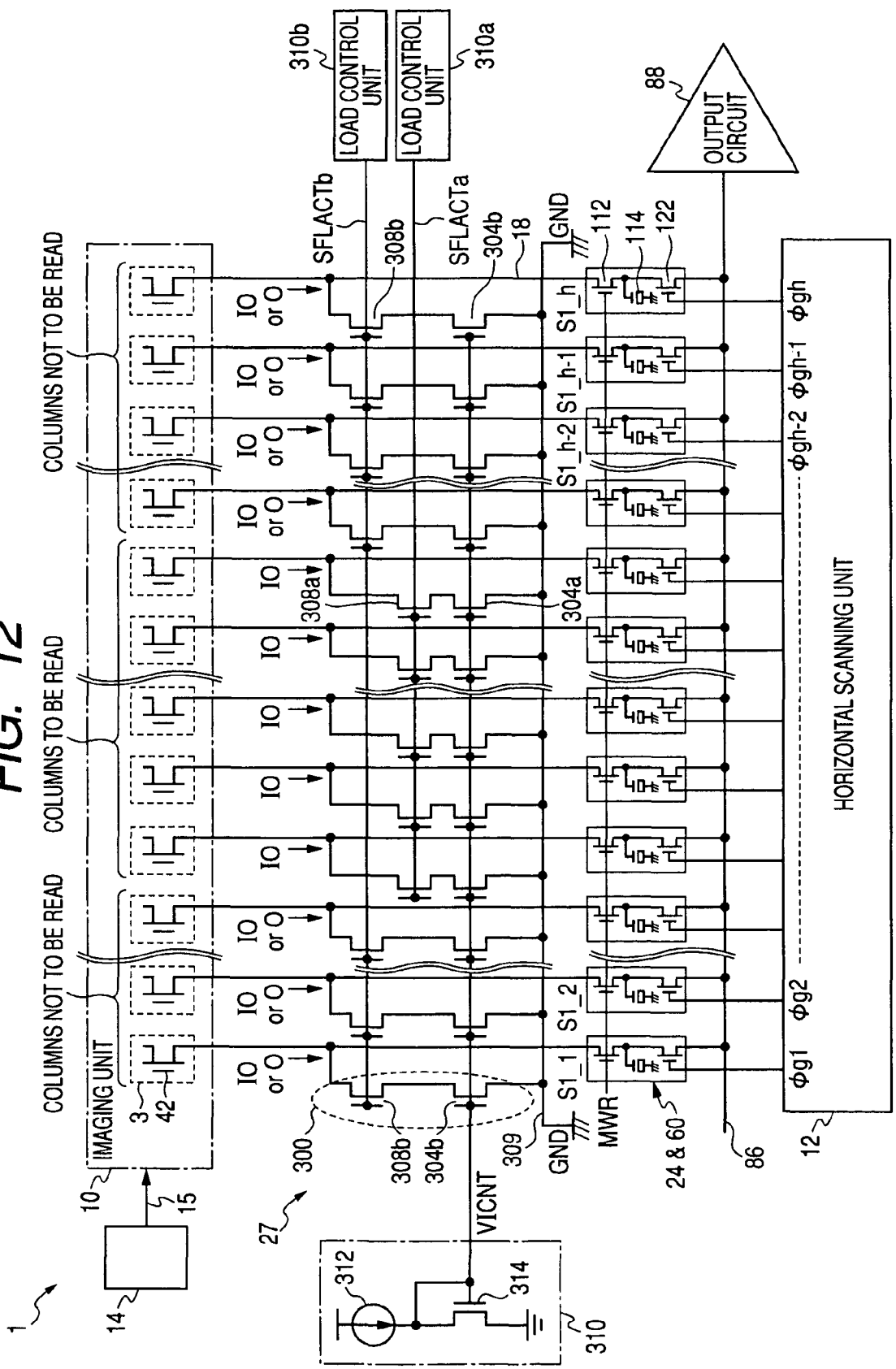
FIG. 12 is a diagram illustrating a circuit structure of a read current source unit according to an eighth embodiment of the invention.

FIG. 12 is a diagram illustrating a circuit structure of a read current source unit 27 according to an eighth embodiment of the invention. According to the structure of the eighth embodiment, as an example of the column selection read mode, instead of the thinning-out read mode, a division mode is used in which a region of a portion of the imaging unit 10 (in a row direction in this example) is divided and the read operation is performed. In particular, according to the eighth embodiment, as in the first and second embodiments, it corresponds to a division mode in which the switch transistor 308 is disposed between the current source transistor 304 and the vertical signal line 18 of each column.

Basically, the switch transistor 308b is provided with respect to at least the column that becomes the non-read subject column in the division mode, and the load control unit 380b that controls the switch transistor 308b with the load control signal SFLACTb may be provided.

As shown in the drawing, the switch transistor 308a is provided with respect to the column becoming the read subject column in the division mode, and the load control unit 380a may be provided which controls the switch transistor 308a with the load control signal SFLACTa. That is, in any case, in the division mode, the switch transistor 308a is disposed with respect to the read subject column and the switch transistor 308b is disposed with respect to the non-read subject column such that they are controlled with the independent load control signals SFLACTa and SFLACTb, and reading the pixel signal is performed according the columns from which the pixel signal does not need to be read out and the column where the pixel signal needs to be read out.

The above-described example corresponds to a modification of the first embodiment. The plurality of columns of the central portion in the horizontal direction are designated as the read subject columns, and the non-read subject columns forming a frame (non-image portion) are disposed at right and left sides. However, this is only an example. For example, the plurality of columns provided at either the right side or the left side in the horizontal direction are designated as the read subject columns, and the remaining columns may be designated as the non-read subject columns. If the divided location may be fixed in advance, the switch transistors 308a and 308b may be simply disposed.

Further, the above-described example corresponds to the modification of the first embodiment. As in the second embodiment, it is possible to use the structure in which the reference voltage supply unit 390 and the voltage stabilization control unit 398 are provided.

In the eighth embodiment, the basic operation is the same as that of the first embodiment. In the division mode, the load control signal SFLACTb is controlled by the load control unit 380b, the switch transistor 308b connected to the vertical signal line 18 of the non-read subject column from which the pixel signal does not need to be read out is set to a non-conductive state, the switch transistor 308a connected to the vertical signal line 18 of the read subject column from which the pixel signal need to be read out is set to a conductive state without accumulating the pixel signal of the non-read subject column in the signal holding unit 24 of the line memory structure, and the pixel signal of the read subject column is accumulated in the signal holding unit 24 of the line memory structure and is then output to the output circuit 88 through the horizontal signal line 86 of the horizontal direction.

Therefore, in the division mode, the pixel information of the plurality of vertical signal lines 18 (in this example, frame columns at right and left sides of the horizontal direction) of which the pixel information is unnecessary can be removed without reading out to the column processing unit 20, and the signals of the plurality of vertical signal lines 18 (in this example, central portion in the horizontal direction) of which the pixel information is necessary can be read out to the column processing unit 20.

Further, in the non-read subject column from which the pixel signal does not need to be read out, since the switch transistor 308b located at the front stage of the current source transistor 304b of the non-read subject column enters a non-conductive state, and the current source transistor 304b of the non-read subject column does not flow the load current Io and can suppress the current consumption of the non-read subject column from which the pixel signal does not need to be read out, which reduces the current consumption.

In the above description, the case where the division location is fixed in advance has been described, but a structure in which the division location can be dynamically changed is also necessary. Therefore, a flexible structure is necessary which can change the connection aspect between the switch transistors 308a and 308b according to the division location. In order to achieve the structure, the gate of the switch transistor 308 of each column can be controlled by the matrix selection in the vertical direction and the horizontal direction, such that the read subject column and the non-read subject column can be dynamically changed.

<Detailed Structure of Read Current Source Unit; Ninth Embodiment>

Figure 13:
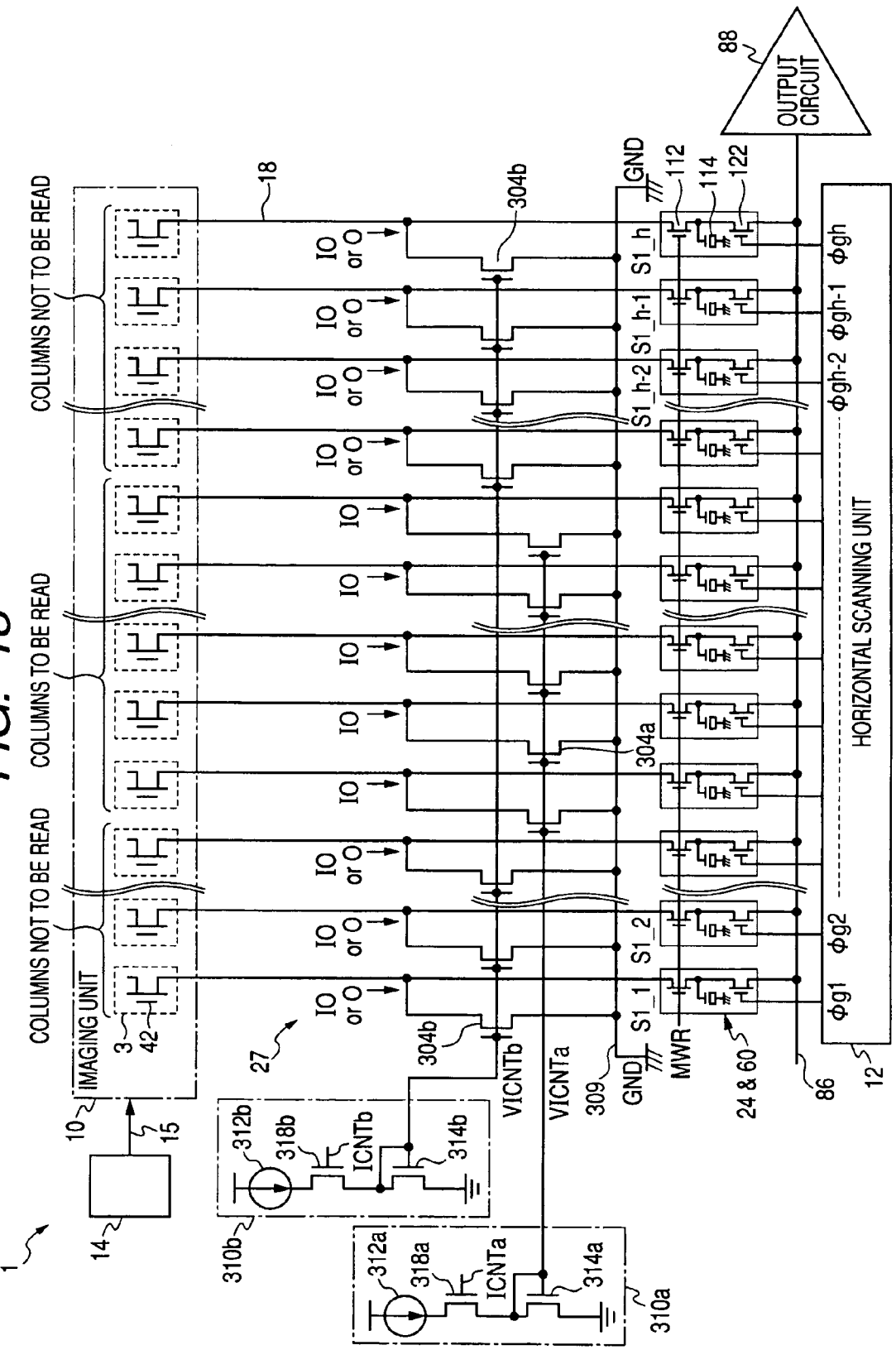
FIG. 13 is a diagram illustrating a circuit structure of a read current source unit according to a ninth embodiment of the invention.

FIG. 13 is a diagram illustrating a circuit structure of a read current source unit 27 according to a ninth embodiment of the invention. The structure according to the ninth embodiment corresponds to the ninth embodiment uses the division mode that is an example of the column selection read mode, similar to the eighth embodiment, and corresponds to the division mode in an aspect of controlling the current source transistor 304 of each column, similar to the third to sixth embodiments. The example shown in FIG. 13 corresponds to a modification of the third embodiment.

Basically, the reference current source unit 310b having the switch transistor 318b may be provided with respect to at least the column becoming the non-read subject column in the division mode, and on/off control may be performed on the gate of the switch transistor 318b by the control signal ICNTb.

As shown in the drawing, the reference current source unit 310a having the switch transistor 318a may be provided with respect to the column becoming the read subject column in the division mode, and on/off control may be performed on the gate of the switch transistor 318a by the control signal ICNTa. Even in any case, in the division mode, the switch transistor 308a is disposed with respect to the read subject column and the switch transistor 308b is disposed with respect to the non-read subject column such that they are controlled with independent load control signals SFLACTa and SFLACTb, and reading the pixel signal is performed according to the columns from which the pixel signals need to be read out and the columns from which the pixel signals do not need to be read out.

Further, whether any range of the imaging unit in the horizontal direction is designated as the read subject column or the non-read subject column may be freely set. If the division location may be fixed in advance, the switch transistors 308a and 308b may be disposed. This point is the same as that of the eighth embodiment.

According to the ninth embodiment, the basic operation is the same as that of the third embodiment. In the division mode, the current control voltage VICNTb is controlled by the reference current source unit 310b such that the current source transistor 304b of the non-read subject column from which the pixel signal does not need to be read out becomes a non-conductive state, the current source transistor 304a connected to the vertical signal line 18 of the read subject column from which the pixel signal needs to be read out is set to a conductive state on without accumulating the pixel signal of the non-read subject column in the signal holding unit 24 of the line memory structure, and the pixel signal of the read subject column is only accumulated in the signal holding unit 24 of the line memory structure, and is then output to the output circuit 88 through the horizontal signal line 86 of the horizontal direction.

Therefore, in the division mode, the pixel information of the plurality of vertical signal lines 18 (in this example, frame columns at right and left sides of the horizontal direction) of which the pixel information is unnecessary can be abandoned without reading out to the column processing unit 20, and the signals of the plurality of vertical signal lines 18 (in this example, central portion in the horizontal direction) of which the pixel information is necessary can be read out to the column processing unit 20.

Further, in the non-read subject column from which the pixel signal does not need to be read out, since the current source transistor 304b of the non-read subject column enters a non-conductive state, the current source transistor 304b of the non-read subject column does not flow the load current Io, and it is possible to suppress the current consumption of the non-read subject column from which the pixel signal does not need to be read out, which reduces the current consumption.

In the above description, the case where the division location is fixed in advance has been described, but a structure in which the division location can be dynamically changed is also necessary. Therefore, similar to the third embodiment, the reference current source unit 310 having the switch transistor 318 is individually prepared with respect to the current source transistor 304 of each column, and the gate of the switch transistor 318 corresponding to each column is controlled by the matrix selection of the vertical direction and the horizontal direction according to the division location, such that the read subject column correspondence and the non-read subject column correspondence can be dynamically changed.

Further, the example shown in the drawing corresponds to a modification of the third embodiment. As in the fourth embodiment, it is possible to use a structure which provides the reference voltage supply unit 390 and the voltage stabilization control unit 398. Further, in addition to providing the reference current source unit 310b having the switch transistor 318b, the current generating unit 312b may be the variable current type, as in the sixth embodiment.

Further, as in the fifth embodiment, the switch circuit 319 may be provided which divides the current control voltage VICNT for a current mirror output from the common reference current source unit 310 into two systems, and a structure may be used which allows to become zero a current flowing through the columns from which the pixel signals do not need to be read out. Further, similar to the seventh embodiment, the reference current source unit 310a that defines an operation current I0 for pixel signal read, and the reference current source unit 310b that defines the minute current Iminute when the pixel signal is not read out are provided, the switch circuit 319 is provided which divides the current control voltages VICNT0 and VICNTm for a current mirror output from the reference current source unit 310a and the reference current source unit 310b into two systems, and a structure may be used which allows to become the minute current Iminute the current flowing through the columns from which the pixel signals do not need to be read out.

It should be understood by those skilled in the art that various modifications, combinations, sub-combinations and alterations may occur depending on design requirements and other factors insofar as they are within the scope of the appended claims or the equivalents thereof.

What is claimed is:

1. A method of acquiring physical information by using a semiconductor device, the semiconductor device including unit elements, each unit element having a unit signal generating unit outputting the unit signal through an output signal line on the basis of the variation in the physical quantity, the method comprising:
   providing an operation current supply unit that supplies an operation current such that the unit signal generating unit outputs the unit signal, and a signal processing unit that receives the unit signal output from each of the unit elements forming the semiconductor device and outputs an output unit signal based on the unit signal at a predetermined timing; and
   when a selective read mode is designated in which the unit signal is read from a portion of the respective unit elements forming the semiconductor device, reducing an operation current of the output signal line of the unit signal generating unit not to be read so as to be smaller than an operation current of the output signal line of the unit signal generating unit to be read, and further wherein a load control unit simultaneously turns off a plurality of signal lines of columns that are not to be read via selectively controlling switches for rows that are switched off, and wherein load transistors selectively provide a read signal thereby reducing power consumption, and further wherein the operating current of signal lines that are not read are reduced with respect to an operating current of signal lines that are read, and the load transistors for the signal lines that are read form source follower circuits in combination with an amplifying transistor for a selected row and a load control signal from the load control unit is applied to the vertical signal line such that a predetermined constant current flows through each vertical signal line of each read subject via load transistors connected to each amplifying transistor and a small amount of current flows through vertical signal lines other than those being read, the load transistor thereby selectively forming a source follower together with an amplifying transistor of a selected row and supplying a read current of a magnitude necessary for pixel signal reading to the amplifying transistor.

2. A physical information acquiring device that acquires physical reformation by using a semiconductor device, the semiconductor device including unit elements, each unit element having a unit signal generating unit outputting the unit signal through an output signal line on the basis of the variation in the physical quantity detected by a detecting unit, the physical information acquiring device comprising:
   an operation current supply unit that supplies an operation current such that the unit signal generating unit outputs the unit signal; and
   a signal processing unit that receives the unit signal output from each of the unit elements forming the semiconductor device and outputs an output unit signal based on the unit signal at a predetermined timing,
   wherein when a selective read mode is designated in which the unit signal is read from a portion of the respective unit elements forming the semiconductor device, the operation current supply unit reduces an operation current of the output signal line of the unit signal generating unit not to be read so as to be smaller than an operation current of the output signal line of the unit signal generating unit to be read, and further wherein a load control unit simultaneously turns off a plurality of signal lines of columns that are not to be read via selectively controlling switches for rows that are switched off, and wherein load transistors selectively provide a read signal thereby reducing power consumption, and further wherein the operating current of signal lines that are not read are reduced with respect to an operating current of signal lines that are read, and the load transistors for the signal lines that are read form source follower circuits in combination with an amplifying transistor for a selected row, and a load control signal from the load control unit is applied to the vertical signal line such that a predetermined constant current flows through each vertical signal line of each read subject via load transistors connected to each amplifying transistor and a small amount of current flows through vertical signal lines other than those being read, the load transistor thereby selectively forming a source follower together with an amplifying transistor of a selected row and supplying a read current of a magnitude necessary for pixel signal reading to the amplifying transistor.

3. The physical information acquiring device according to claim 2, wherein when the selective read mode is designated, the operation current supply unit allows to become zero the operation current of the unit signal generating unit not to be read.

4. The physical information acquiring device according to claim 3,
   wherein the operation current supply unit includes:
   a reference voltage supply unit that allows to have a predetermined value an operation point potential of the output signal line of the unit signal generating unit not to be read.

5. The physical information acquiring device according to claim 2,
   wherein the operation current supply unit includes current sources, each of which is provided for each output signal line of the unit signal generating unit, and supplies the operation current to the output signal line, and
   when the selective read mode is designated, the operation current supply unit controls the current source for the unit signal generating unit not to be read, and reduces a current flowing through the current source so as to be smaller than a current flowing the current source for the unit signal generating unit to be read.

6. The physical information acquiring device according to claim 2,
   wherein the operation current supply unit includes:
   current sources, each of which is provided for each output signal line of the unit signal generating unit, and supplies the operation current to the output signal line;
   switches that are provided between the output signal lines and the current sources and turn on/off a current path; and
   a switch control unit that allows, when the selective read mode is designated, the switch for the unit signal generating unit not to be read to enter a non-conductive state.

7. The physical information acquiring device according to claim 6, wherein when the selective read mode is designated, the current control unit allows to enter a non-conductive state the current source for the unit signal generating unit not to be read.

8. The physical information acquiring device according to claim 2,
wherein the operation current supply unit includes:
current sources, each of which is provided for each output signal line of the unit signal generating unit, and supplies the operation current to the output signal line, and
a current control unit that controls, when the selective read mode is designated, the current source for the unit signal generating unit not to be read, and reduces a current flowing through the current source so as to be smaller than a current flowing through the current source for the unit signal generating unit to be read.

* * * * *